(12) United States Patent
Fujita et al.

(10) Patent No.: US 8,245,754 B2
(45) Date of Patent: Aug. 21, 2012

(54) PEELING APPARATUS, PEELING METHOD, AND METHOD OF MANUFACTURING INFORMATION RECORDING MEDIUM

(75) Inventors: Minoru Fujita, Tokyo (JP); Shigeki Ishiyama, Tokyo (JP)

(73) Assignee: TDK Corporation, Tokyo (JP)

( * ) Notice: Subject to any disclaimer, the term of this patent is extended or adjusted under 35 U.S.C. 154(b) by 220 days.

(21) Appl. No.: 12/337,100

(22) Filed: Dec. 17, 2008

(65) Prior Publication Data
US 2009/0166930 A1 Jul. 2, 2009

(30) Foreign Application Priority Data

Dec. 27, 2007 (JP) ................................. 2007-335719

(51) Int. Cl.
*B32B 38/10* (2006.01)
(52) U.S. Cl. ........................... 156/764; 156/714; 29/239
(58) Field of Classification Search .................. 156/344, 156/584, 714, 718, 763, 764; 29/239
See application file for complete search history.

(56) References Cited

U.S. PATENT DOCUMENTS

| | | | | |
|---|---|---|---|---|
| 3,443,297 A | * | 5/1969 | Lusby, Jr. .......................... | 29/764 |
| 5,240,546 A | * | 8/1993 | Shiga .............................. | 156/378 |
| 5,367,762 A | * | 11/1994 | Disko et al. ...................... | 29/764 |
| 5,432,318 A | * | 7/1995 | Minahan ......................... | 219/385 |
| 5,715,592 A | * | 2/1998 | Mori et al. ....................... | 29/762 |
| 5,772,842 A | * | 6/1998 | Tanaka et al. .................. | 156/718 |
| 5,842,261 A | * | 12/1998 | Ortiz .............................. | 29/426.5 |
| 5,976,307 A | * | 11/1999 | Cook, Jr. ....................... | 156/701 |
| 6,444,082 B1 | * | 9/2002 | Campbell et al. ............... | 156/717 |
| 6,640,426 B2 | * | 11/2003 | Sonnichsen ..................... | 29/758 |
| 6,749,713 B2 | * | 6/2004 | Mlinar ............................ | 156/701 |
| 7,052,934 B2 | * | 5/2006 | Kurimoto et al. ............. | 438/106 |
| 2004/0149096 A1 | | 8/2004 | Ide et al. | |
| 2004/0149111 A1 | | 8/2004 | Ide et al. | |
| 2005/0045583 A1 | | 3/2005 | Fujita et al. | |
| 2005/0116370 A1 | | 6/2005 | Ogino et al. | |
| 2005/0263915 A1 | | 12/2005 | Fujita et al. | |
| 2006/0006580 A1 | | 1/2006 | Olsson et al. | |
| 2007/0009655 A1 | | 1/2007 | Yamazaki et al. | |
| 2007/0119893 A1 | * | 5/2007 | Rayssac et al. ..................... | 225/2 |
| 2009/0239156 A1 | * | 9/2009 | Andritzke et al. ................. | 430/5 |
| 2009/0314430 A1 | * | 12/2009 | Nakamura ..................... | 156/344 |

FOREIGN PATENT DOCUMENTS

| | | |
|---|---|---|
| JP | 2003-062845 | 3/2003 |
| JP | 2005-153091 | 6/2005 |
| JP | 2005-537656 | 12/2005 |
| JP | 2006-088517 | 4/2006 |
| WO | 2004/021083 | 3/2004 |

OTHER PUBLICATIONS

English language Abstract of JP 2005-153091, Jun. 16, 2005. English language Abstract of JP 2005-537656, Dec. 8, 2005.

* cited by examiner

*Primary Examiner* — Mark A Osele
(74) *Attorney, Agent, or Firm* — Greenblum & Bernstein, P.L.C.

(57) ABSTRACT

A peeling apparatus including a first holding section that holds a first object which is in the form of a flat plate, and a second holding section that holds a second object which is in the form of a flat plate and is affixed to the first object to be integral, the peeling apparatus being configured to be capable of peeling one of the first object and the second object off the other in a state in which the first holding section holds the first object and the second holding section holds the second object. The first holding section holds the first object by being brought into contact with a surface of the first object along a direction of a thickness thereof via at least two points.

2 Claims, 9 Drawing Sheets

PEELING APPARATUS, PEELING METHOD, AND METHOD OF MANUFACTURING INFORMATION RECORDING MEDIUM

BACKGROUND OF THE INVENTION

1. Field of the Invention

The present invention relates to a peeling apparatus and a peeling method for peeling one of a first object and a second object which are affixed to each other to be integral with each other from the other, and a method of manufacturing an information recording medium using the peeling method.

2. Description of the Related Art

For example, Japanese Laid-Open Patent Publication (Kokai) No. 2005-153091 discloses a transfer apparatus (transfer method) that presses a stamper against a substrate having a polystyrene resin film formed on a silicon wafer and peels the stamper off the substrate, to thereby transfer a concave/convex pattern of the stamper to a surface of the substrate. This transfer apparatus is provided with a positioning unit for pressing the stamper against the substrate, a pressure unit, a peeling unit for peeling the stamper off the substrate, and so forth. When the transfer apparatus is used to perform a process for transferring the concave/convex pattern, first, the stamper and the substrate, which are brought into intimate contact with each other in a state positioned with respect to each other by the positioning unit, are conveyed to the pressure unit, and are pressurized (pressed) in a vacuum chamber while being heated to a predetermined temperature. Next, the pressurized substrate and stamper are cooled, and then in this state, they are conveyed to the peeling unit, and are set between an attracting stage and an attracting head.

Next, the substrate is fixed to the attracting stage by attracting the back surface thereof (surface of the substrate opposite from the surface affixed to the stamper) to the attracting stage, and the foremost end of a peeling wedge disposed on the attracting stage is inserted into an interface between the substrate and the stamper. Subsequently, a head supporting plate is lowered to bring the attracting head into contact with the back surface of the stamper (surface of the stamper opposite from the surface affixed to the substrate). In this state, the stamper is fixed to the attracting head (the head supporting plate) by attracting the back surface of the stamper to the attracting head, and the foremost end of a peeling wedge disposed on the head supporting plate is inserted into the interface between the substrate and the stamper. In this state, the head supporting plate is inclined at an angle of approximately 1 to 10 degrees with respect to the attracting stage, whereby the stamper fixed to the head supporting plate is peeled off the substrate fixed to the attracting stage. This transfers the concave/convex pattern of the stamper to the substrate to complete a sequence of operations of the transfer process.

SUMMARY OF THE INVENTION

From the study of the above-described conventional transfer apparatus, the present inventors found the following problems: The conventional transfer apparatus is configured such that in peeling the stamper off the substrate, the substrate is fixed to the attracting stage by attracting the back surface thereof to the attracting stage, and the stamper is fixed to the attracting head (the head supporting plate) by attracting the back surface thereof to the attracting head. Therefore, the conventional transfer apparatus suffers from the problems that oil and dust is deposited on the surface of the silicon wafer of the substrate (the back surface of the substrate) due to a contact between the substrate and the attracting stage (hereinafter, this state is also referred to as a "stained" state), and that contact marks are formed by contact between the attracting stage and the surface of the silicon wafer (hereinafter, this state is also referred to as a "scratched" state). In this case, when the above-described substrate is a preform e.g., for manufacturing an information recording medium and a semiconductor device, stains or scratches formed on the substrate make it difficult to manufacture products excellent in recording and reproducing characteristics and electric characteristics, so that it is necessary to give a reliable solution to the above-mentioned problems when such products are manufactured by the transfer method of this kind.

On the other hand, the present inventors have developed a patterned medium (discrete track medium) which has a servo pattern and a data track pattern formed on opposite surfaces of a substrate by concave/convex patterns. When the concave/convex patterns are transferred by pressing stampers against opposite surfaces of a preform (the substrate in the above-mentioned example) by using a device having the same construction as that of the above-described transfer apparatus (by the same method as the above-described transfer method) during manufacturing of this patterned medium, the preform is stained or scratched when the stampers are peeled off the preform.

More specifically, as shown in FIG. 18, in a state in which a stamper 30A and a stamper 30B are pressed against a first surface 10a and a second surface 10b of a preform 10x from which a patterned medium is to be manufactured, respectively, when the stamper 30B is peeled off the second surface 10b of the preform 10x (when one of peeling objects is formed by plural plate elements affixed to each other (the stamper 30A and the preform 10x, in the illustrated example) and the other peeling object (the stamper 30B, in the illustrated example) is peeled off the plural plate elements), for example, using a peeling apparatus 3x provided with a pair of stamper holding sections 52 having plural attracting pads 62, first, as shown therein, the upper stamper holding section 52 is caused to hold the stamper 30A by attracting the back surface (upper surface, as viewed in FIG. 18) of the stamper 30A thereto using the attracting pads 62 thereof, and the lower stamper holding section 52 is caused to hold the stamper 30B by attracting the back surface (lower surface, as viewed in FIG. 18) of the stamper 30B thereto using the attracting pads 62 thereof. Then, for example, the upper stamper holding section 52 is moved (lifted) with respect to the lower stamper holding section 52 in a direction indicated by an arrow B.

In doing this, since the back surfaces of the stampers 30A and 30B are attracted and held by the plural attracting pads 62, forces in respective directions of peeling the stampers 30A and 30B off the preform 10x are approximately uniformly applied to the whole areas of the stampers 30A and 30B. Therefore, as indicated by solid lines in FIG. 19, although the stamper 30B is about to be peeled off the preform 10x while maintaining the state of the preform 10x being in intimate contact with the stamper 30A, the preform 10x is sometimes peeled off the stamper 30A with the preform 10x being in intimate contact with the stamper 30B, as indicated by a one-dot chain line in FIG. 19. As a consequence, when the sequence of steps is automated, although actually, the preform 10x is in intimate contact with the stamper 30B, it is determined that peeling of the stamper 30B off the preform 10x is completed, and the stamper 30B is stacked at a predetermined process completion position. At this time, the preform 10x in intimate contact with the stamper 30B can be stained or scratched. Further, as indicated by broken lines in FIG. 19, there is also a risk that both the stampers 30A and 30B are peeled off the preform 10x. In such a state, the preform 10x peeled off the stampers 30A and 30B comes off the peeling apparatus 3x, and is stained or scratched.

The present invention has been made in view of these problems, and a main object of the present invention is to provide a peeling apparatus, a peeling method, and a method of manufacturing an information recording medium, which are capable of preventing peeling objects from being stained or scratched.

To attain the above main object, a peeling apparatus according to the present invention includes a first holding section that holds a first object which is in the form of a flat plate, and a second holding section that holds a second object which is in the form of a flat plate and is affixed to the first object to be integral therewith, the peeling apparatus being configured to be capable of peeling one of the first object and the second object off the other in a state in which the first holding section holds the first object and the second holding section holds the second object, and wherein the first holding section holds the first object by being brought into contact with a surface of the first object along a direction of a thickness thereof via at least two points.

It should be noted that the construction that "holds the first object by being brought into contact with a surface of the first object along a direction of a thickness thereof via at least two points" includes not only a construction that holds the first object by being brought into point contact with the surface of the first object along the direction of the thickness thereof via two or more portions thereof but also a construction that holds the first object by being brought into line contact with the surface of the first object via two or more portions thereof, and a construction that holds the first object by being brought into surface contact with the surface of the first object via two or more portions thereof. In this case, the construction that "holds the first object by being brought into line contact with the surface of the first object via two or more portion thereof" includes both a construction that holds the first object by being brought into contact with a long linear area of the first object along the direction of the thickness thereof, and a construction that holds the first object by being brought into contact with a long linear area of the first object along a direction of an outer periphery (or an inner periphery) thereof (part or a whole of the outer periphery, or part or a whole of the inner periphery). Further, the construction that "holds the first object by being brought into surface contact with the surface of the first object via two or portions thereof" includes a construction that holds the first object by being brought into contact with part or a whole of an outer peripheral surface (or an inner peripheral surface) of the first object. Further, throughout the present specification, the term "first object which is in the form of a flat plate" and "second object which is in the form of a flat plate" include not only an article formed by a single flat plate but also an article formed by two or more flat plates affixed to each other to be integral with each other (a laminate formed by two or more flat plates). In this case, the above-described "article formed by two or more flat plates affixed to each other to be integral with each other" includes not only an article formed by flat plates equal in size and shape in plan view but also an article formed by affixing flat plates different in size and shape in plan view to each other to be integral with each other.

Further, according to a peeling method according to the present invention, in a state holding a first object which is in a form of a flat plate, and a second object which is in a form of a flat plate and is affixed to the first object to be integral therewith, in peeling one of the first object and the second object off the other, while holding the first object by contact with a surface of the first object along a direction of a thickness thereof via at least two points, the other is peeled off.

According to these peeling apparatus and peeling method, in the state holding the first object, and the second object that is affixed to the first object to be integral therewith, in peeling one of the first object and the second object off the other, the first object is held by contact with a surface of the first object along a direction of a thickness thereof via at least two points, whereby when the first object is peeled off the second object, by holding the first object in a state in which the peeling apparatus is kept from contact with the back surface of the first object (surface of the first object opposite from a surface thereof affixed to the second object), which makes it possible to prevent the back surface of the first object from being stained or scratched. Further, according to the above peeling apparatus and peeling method, the second object is formed by plural plate elements affixed to each other to be integral with each other, and when the first object is peeled off the second object in a state in which part of each plate element is held by the second holding section, the first object bends whereby it is easily peeled off the second object. As a result, it is possible to prevent a plate element which is one of the above-described plate elements forming the second object and is affixed to the first object, from being peeled off a plate element held by the second holding section, to thereby reliably peel the first object while maintaining the state of the plate elements being affixed to each other. Accordingly, even if the sequence of steps is automated, it is possible to prevent a state where the plate element is stained or scratched due to the plate element of the second object, affixed to the first object, being peeled off the plate element held by the second holding section together with the first object, and being stacked together with the first object at the predetermined process completion position. Further, it is possible to prevent the plate element affixed to the first object from being unintentionally peeled and coming off the plate element held by the second holding section. This makes it possible to prevent the plate element affixed to the first object from being stained or scratched.

Further, in the peeling apparatus according to the present invention, a portion is formed at a location toward the second holding section with respect to a portion brought into contact with the first object in a surface of the first holding section for contact with the first object.

Further, in the peeling method according to the present invention, in holding the first object, a holding tool wherein a protrusion is formed at a location toward the second object with respect to a portion brought into contact with the first object in a surface of the holding tool for contact with the first object is used to thereby hold the first object while causing the protrusion to be brought into contact with a periphery of the first object toward the second object.

According to these peeling apparatus and peeling method, in peeling the first object off the second object, it is possible to reliably peel the first object off the second object, while preventing the first object from coming off the first holding section and moving toward the second holding section together with the second object, which makes it possible to prevent the first object from being stained or scratched.

Further, in the peeling apparatus according to the present invention, the second holding section holds the second object by being brought into contact with a surface of the second object opposite from a surface thereof affixed to the first object.

Further, in the peeling method according to the present invention, the second object is held by contact with a surface of the second object opposite from a surface thereof affixed to the first object.

According to these peeling apparatus and peeling method, the second object is formed by the plural plate elements affixed to each other to be integral with each other, and when the first object is peeled off the second object in the state in which part of each plate element is held by the second holding section, it is possible to prevent the plate element held by the second holding section being bent to cause the plate element affixed to the first object from being peeled and come off the plate element held by the second holding section. This makes it possible to prevent the plate element affixed to the first object from being stained or scratched.

Further, in the peeling apparatus according to the present invention, the first holding section holds the first object by being brought into contact with an outer peripheral surface of the first object as the surface along the direction of the thickness thereof.

Further, in the peeling method according to the present invention, the first object is held by contact with an outer peripheral surface of the first object as the surface along the direction of the thickness thereof.

According to these peeling apparatus and peeling method, for example, compared with a construction in which the first object is held by contact with an inner peripheral surfaces of a central hole of the first object, it is possible to reliably hold the first object, so that it is possible to prevent the first object and the second object from being stained or scratched.

Further, according to a method of manufacturing an information recording medium according to the present invention, an A stamper formed with an A1 concave/convex pattern is pressed against one surface of a substrate, and a B stamper formed with a B1 concave/convex pattern is pressed against the other surface of the substrate, whereafter the A stamper and the B stamper are peeled off the substrate to thereby form an A2 concave/convex pattern having an inverted concave/convex positional relationship with respect to the A1 concave/convex pattern on the one surface of the substrate, and form a B2 concave/convex pattern having an inverted concave/convex positional relationship with respect to the B1 concave/convex pattern on the other surface of the substrate, and an information recording medium is manufactured by using the A2 concave/convex pattern and the B2 concave/convex pattern, wherein in peeling the B stamper off the substrate that is integrated with the A stamper by pressing the A stamper against the substrate, while holding the B stamper by contact with a surface of the B stamper along a direction of a thickness thereof via at least two points, the B stamper is peeled off.

According to this method of manufacturing an information recording medium, when the B stamper is peeled off the substrate that is integrated with the A stamper by pressing the A stamper against the substrate, the B stamper is peeled while holding the B stamper by contact with the surface of the B stamper along the direction of a thickness thereof via at least two points, whereby the B stamper bends to be easily peeled off the substrate. This makes it possible to prevent the substrate from being peeled off the A stamper, to thereby reliably peel the B stamper while maintaining the state of the substrate being affixed to the A stamper. Accordingly, even if the sequence of steps is automated, it is possible to prevent a state where the substrate is stained or scratched due to the substrate being peeled off the A stamper together with the B stamper, and being stacked together with the B stamper at the predetermined process completion position. Further, it is possible to prevent unintended removal of the substrate from the A stamper, which makes it possible to prevent the substrate from being stained or scratched by the removal of the substrate from both the A stamper and the B stamper.

Further, according to a method of manufacturing an information recording medium according to the present invention, a C stamper formed with a C1 concave/convex pattern is pressed against one surface of a substrate, whereafter the C stamper is peeled off the substrate to thereby form a C2 concave/convex pattern having an inverted concave/convex positional relationship with respect to the C1 concave/convex pattern on the one surface of the substrate, and an information recording medium is manufactured by using the C2 concave/convex pattern, wherein in peeling the C stamper off the substrate, while holding the substrate by contact with a surface of the substrate along a direction of a thickness thereof via at least two points, the C stamper is peeled off.

According to this method of manufacturing an information recording medium, when the C stamper is peeled off the substrate, the C stamper is peeled while holding the substrate by contact with the surface of the substrate along the direction of the thickness thereof via at least two points. This makes it possible to hold the substrate in a state in which the peeling apparatus is kept from contact with the back surface of the substrate (surface of the substrate opposite from a surface thereof affixed to the C stamper), thereby making it possible to prevent the back surface of the substrate from being stained or scratched.

It should be noted that the present disclosure relates to the subject matters included in Japanese Patent Application No. 2007-335719 filed Dec. 27, 2007, and it is apparent that all the disclosures therein are incorporated herein by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Now, the respective best modes of a peeling apparatus, a peeling method, and a method of manufacturing an information recording medium according to the present invention will be described with reference to the accompanying drawings.

First, a description will be given of the construction of a magnetic recording medium manufacturing system 1, which manufactures an information recording medium by the method of manufacturing an information recording medium according to the present invention, with reference to the drawings.

Figure 1:
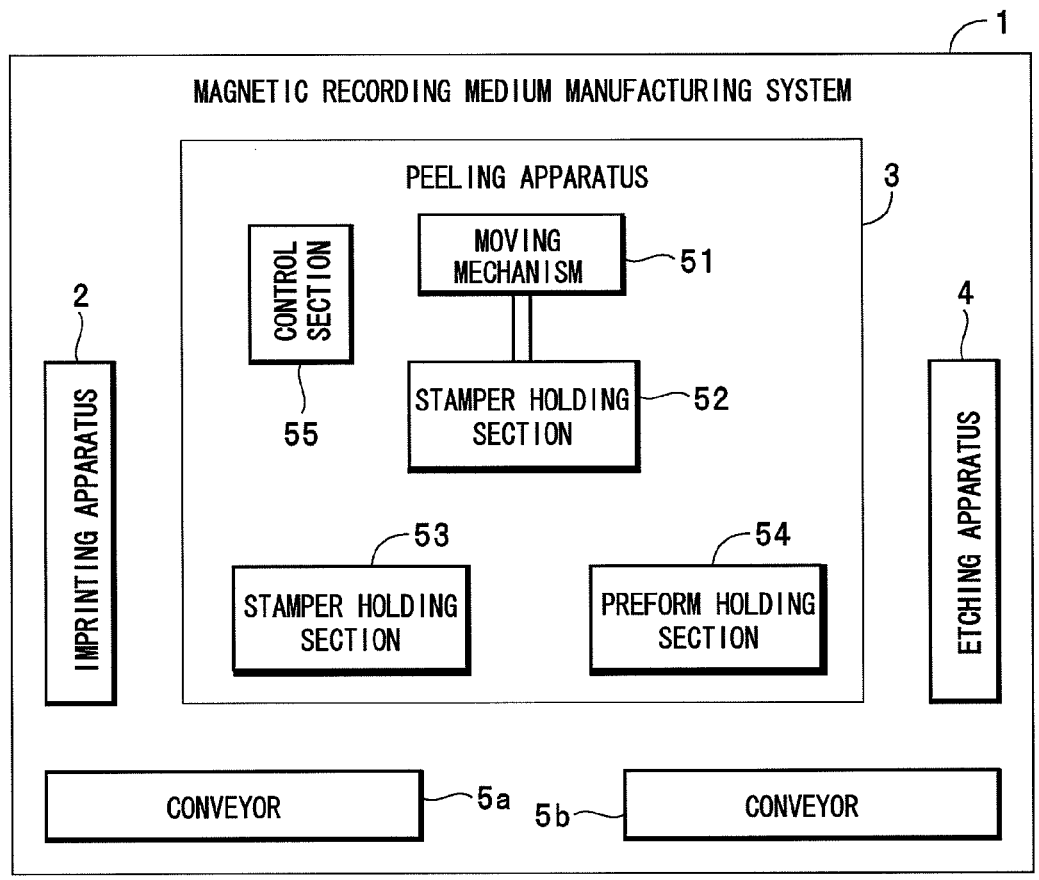
FIG. 1 is a schematic diagram showing the construction of a magnetic recording medium manufacturing system.
Figure 2:
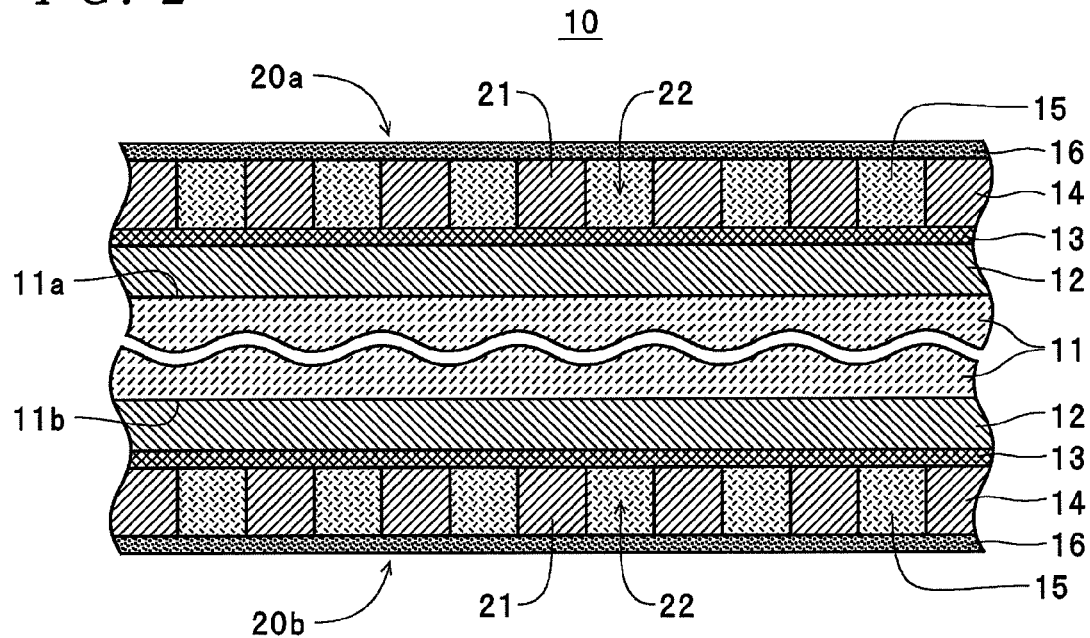
FIG. 2 is a cross-sectional view of a magnetic disk.

Referring to FIG. 1, the magnetic recording medium manufacturing system 1 is a manufacturing system configured to be capable of manufacturing a magnetic disk 10 (an example of the information recording medium in the present invention) shown in FIG. 2, by the method of manufacturing an information recording medium according to the present invention, and is comprised of an imprinting apparatus 2, a peeling apparatus 3, an etching apparatus 4, and conveyors 5a and 5b. In this case, the magnetic disk 10 is a discrete track medium (an example of a patterned medium) which is accommodated in a casing together with a controller, not shown, a magnetic head, a motor, and so forth, forming a hard disk drive (recording/reproducing device). As described hereinafter, the magnetic disk 10 is manufactured by using a preform 10x and stampers 30A and 30B, shown in FIG. 3. Further, as shown in FIG. 2, the magnetic disk 10 has a soft magnetic layer 12, an intermediate layer 13, and a magnetic layer 14 sequentially formed on each of a first surface 11a and a second surface 11b of a glass base plate 11 in the mentioned order, such that the magnetic disk 10 is capable of recording data e.g., by a perpendicular recording method. It should be noted that the figures referred to in the present specification illustrate the layers with a different ratio in the magnitude of thickness therebetween from an actual one, for ease of understanding of the present invention.

Further, formed on the magnetic disk 10 are e.g., plural convex portions 21 each having a protruding end made of a magnetic material (magnetic layer 14) and plural concave portions 22 formed between adjacent convex portions 21, thereby forming concave/convex patterns 20a and 20b each of which forms a data track pattern and a servo pattern. Furthermore, a non-magnetic material 15, such as $SiO_2$, C (carbon), Si, Ge, a non-magnetic metal material, or a resin material, is embedded in each of the concave portions 22 of the concave/convex patterns 20a and 20b, whereby the front surface and back surface of the magnetic disk 10 are made smooth. Further, on the magnetic disk 10, a protective layer 16 (DLC layer) is formed e.g., by diamond-like carbon (DLC) in a manner covering the surfaces of the non-magnetic material 15 embedded in the concave portions 22 (embedded between the adjacent convex portions 21), and the magnetic layer 14 (convex portions 21). Further, the protective layer 16 has a surface coated with lubricant (fluorine-based lubricant, for example) for preventing both the magnetic head and the magnetic disk 10 from being damaged.

Figure 3:
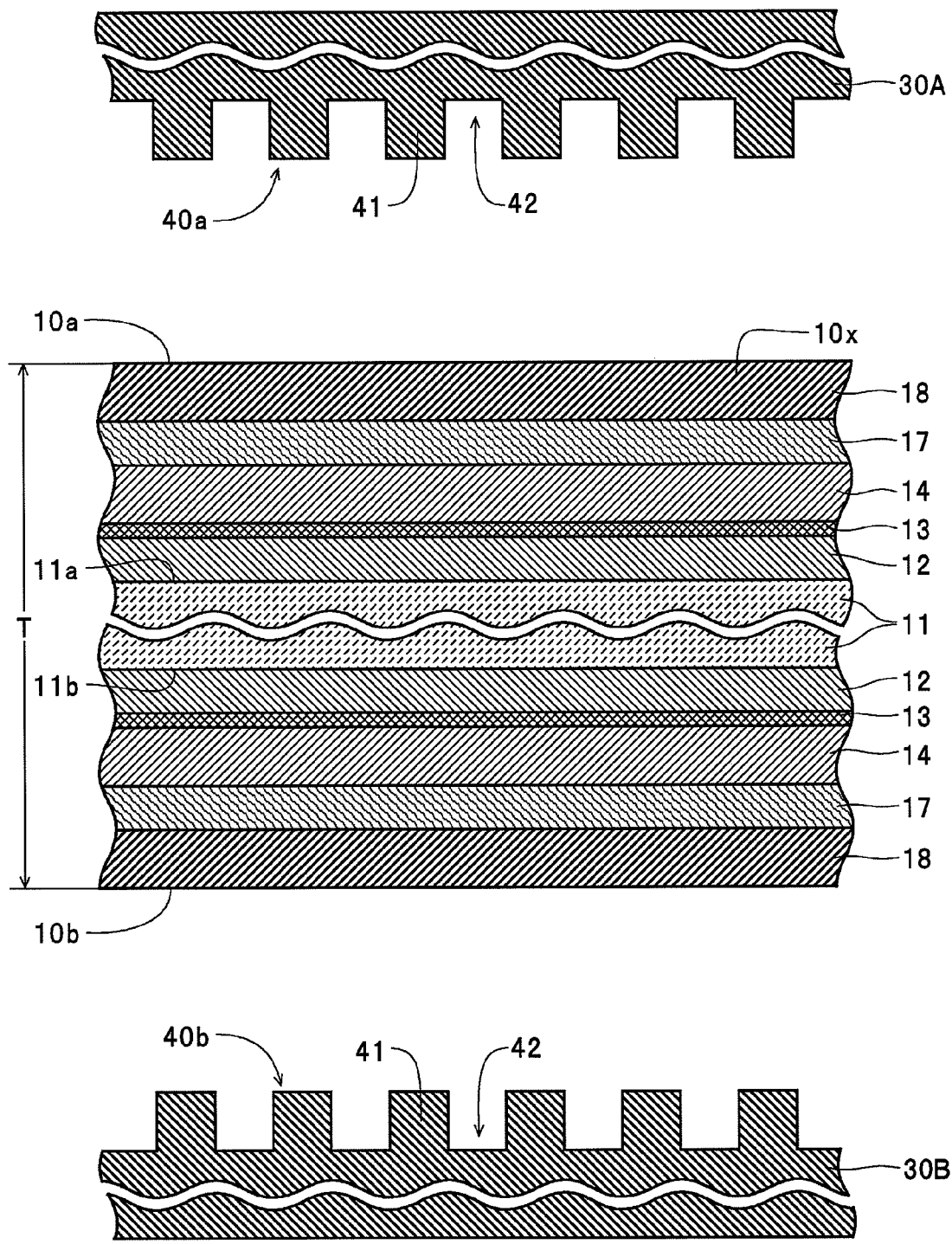
FIG. 3 is a cross-sectional view of a preform and each stamper for manufacturing the magnetic disk.
Figure 6:
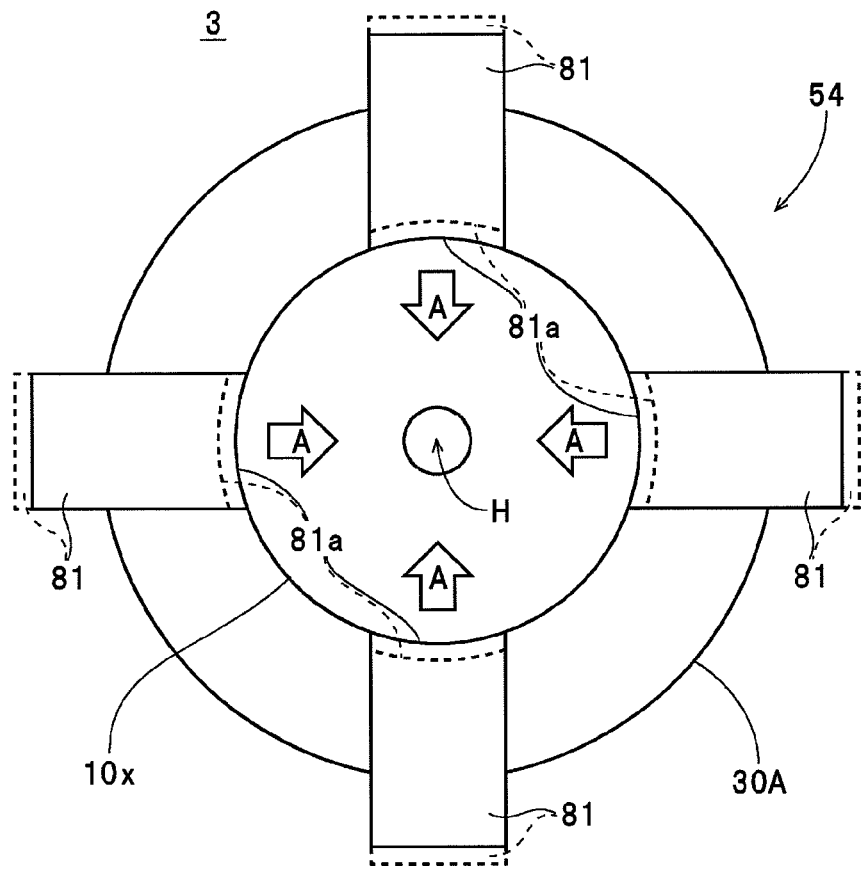
FIG. 6 is a plan view of a preform holding section of the peeling apparatus, as viewed from below (from a preform side)
Figure 7:
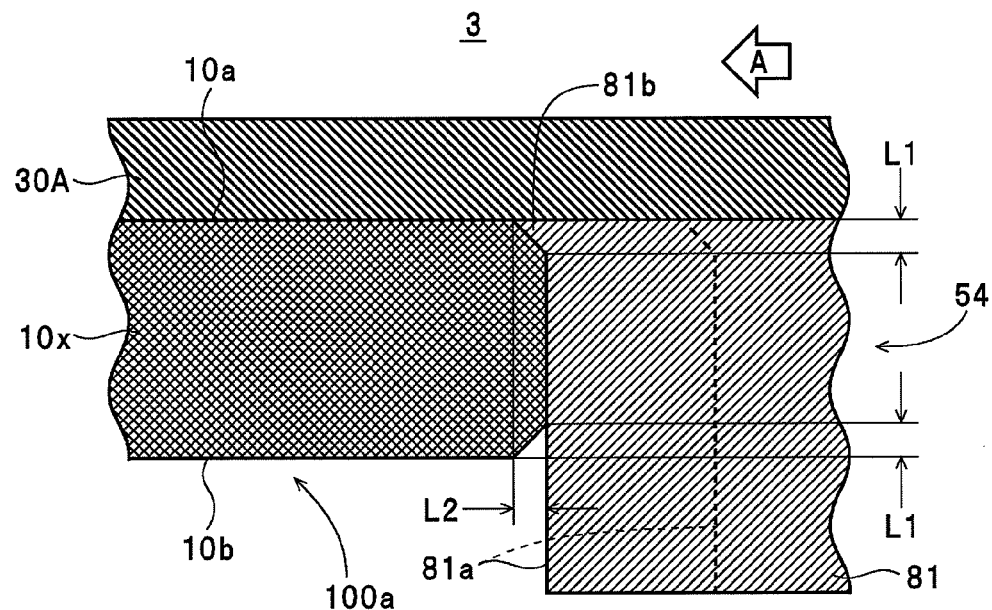
FIG. 7 is a cross-sectional view of holding nails of the preform holding section and an outer periphery of the preform.

Further, the preform 10x for manufacturing the magnetic disk 10 is an example of a substrate in the present invention. As shown in FIG. 3, the preform 10x has the soft magnetic layer 12, the intermediate layer 13, the magnetic layer 14, a B mask layer 17, and an A mask layer 18 sequentially formed on each of the first surface 11a and second surface 11b of the glass base plate 11 in the mentioned order. The preform 10x is formed such that it has a diameter of approximately 48 mm, and a total thickness T of approximately 0.6 mm. Further, as shown in FIG. 6, the preform 10x has a central portion formed with a central hole H for inserting a rotating shaft of the motor in a completed state of the magnetic disk 10. Furthermore, as shown in FIG. 7, corner portions of the preform 10x on an outer periphery side thereof are chamfered by both a length L1 along the direction of the thickness of the preform 10x (the vertical direction as viewed in FIG. 7), and a length L2 along the plane of the preform 10x (the left-right direction as viewed in FIG. 7) within a range of approximately 0.1 mm to 0.3 mm (e.g., both of the length L1 and the length L2 are 0.15 mm). Similarly, the rim of the central hole H of the preform 10x (corner portions, not shown, of the preform 10x on an inner periphery side thereof) is chamfered within the same range as the range of the lengths of the chamfers of the corner portions of the preform 10x on the outer periphery side thereof.

The glass base plate 11 is configured to be a disk-shaped substrate by polishing the surface of a glass plate. It should be noted that the base plate for use in forming the preform 10x (magnetic disk 10) is not limited to glass base plate, but as the substrate, there may be used any suitable one which is formed e.g., of any of non-magnetic materials, such as aluminum and ceramics, such that it is generally disk-shaped. The soft magnetic layer 12 is in the form of a thin film having a thickness of approximately 30 nm to 200 nm and is formed by sputtering a soft magnetic material, such as a CoFeNb alloy. The intermediate layer 13, which serves as an underlayer for forming the magnetic layer 14 thereon, is in the form of a thin film having a thickness of approximately 20 nm to 40 nm and is formed by sputtering an intermediate layer forming material, such as Ru, Cr or a CoCr non-magnetic alloy. The magnetic layer 14 is a layer on which the concave/convex patterns 20a and 20b (foremost ends of the convex portions 21) are formed, as described above, and includes the concave portions 22 which are formed to have a depth reaching the intermediate layer 13, by etching a layer formed e.g., by sputtering a CoCrPt alloy such that the layer has a thickness of approximately 10 nm to 30 nm, using the B mask layer 17 as a mask.

The B mask layer 17 serves as the mask for forming the above-described concave portions 22 in the magnetic layer 14 by etching. The B mask layer 17 is in the form of a thin film having a thickness of approximately 10 nm to 30 nm, and is made of a metal material such as Ni or Ta, or C (carbon), for example. The A mask layer 18 is a mask layer used for etching the B mask layer 17 such that the B mask layer 17 is caused to serve as the mask. The A mask layer 18 is e.g., in the form of a thin film having a thickness of approximately 10 nm to 80 nm, and is made of an ultraviolet-curing resin material (e.g., an acrylic resin), for example. In this case, in the preform 10x, an A2 concave/convex pattern and a B2 concave/convex pattern in the present invention are formed in the respective A mask layers 18 by a transfer process, described hereinafter. It should be noted that in the following description, the surface of the A mask layer 18 formed toward the first surface 11a of the glass base plate 11 is referred to as the "first surface 10a" of the preform 10x, and the surface of the A mask layer 18 formed toward the second surface 11b of the glass base plate 11 is referred to as the "second surface 10b" of the preform 10x.

In this case, the preform 10x forms a second object in the present invention together with the stamper 30A, in a state in which the stampers 30A and 30B are affixed to the first surface 10a and the second surface 10b, respectively, whereby the preform 10x and the stampers 30A and 30B are made integral with each other (see FIG. 8) (an example of a state in which "the second object" in the present invention is formed by plural plate elements affixed to each other). It should be noted that in the following description, a structure formed by making the preform 10x and the stampers 30A and 30B integral with each other is also referred to as the "laminate 100". Further, the preform 10x forms a first object in the present invention in a state in which the stamper 30B is peeled off the laminate 100 (a state in which the stamper 30A is affixed to the first surface 10a, whereby the preform 10x and the stamper 30A are made integral with each other: see FIG. 11). It should be noted that in the following description, a structure formed by peeling the stamper 30B off the laminate 100 (structure formed by the preform 10x and the stamper 30A that are made integral with each other) is also referred to as the "laminate 100a".

The stamper 30A is an example of an A stamper in the present invention, and an example of a C stamper in the present invention. The stamper 30A is formed of a light-transmitting resin material, for example, such that it has a shape of a disk having a diameter of approximately 80 mm and a thickness of approximately 0.6 mm. As shown in FIG. 3, the stamper 30A is formed with plural convex portions 41 corresponding to the concave portions 22 of the concave/convex pattern 20a of the magnetic disk 10, and plural concave portions 42 corresponding to the convex portions 21 of the concave/convex pattern 20a, such that a concave/convex pattern 40a (an example of each of an "A1 concave/convex pattern" and a "C1 concave/convex pattern" in the present invention) having an inverted concave/convex positional relationship with respect to the concave/convex pattern 20a is formed. In this case, as described above, the stamper 30A forms the second object in the present invention together with the preform 10x, in the state in which the stamper 30A is affixed to the first surface 10a of the preform 10x to whose second surface 10b the stamper 30B is affixed (the state in which the preform 10x and the stampers 30A and 30B are made integral with each other: see FIG. 8). Further, the stamper 30A forms the second object in the present invention in the state in which the stamper 30B is peeled off the preform 10x (the state in which the stamper 30A is affixed to the first surface 10a, whereby the preform 10x and the stamper 30A are made integral with each other: see FIG. 11).

The stamper 30B is an example of a B stamper in the present invention. Similarly to the above-described stamper 30A, the stamper 30B is formed of a light-transmitting resin material, for example, such that it has a shape of a disk having a diameter of approximately 80 mm and a thickness of approximately 0.6 mm. The stamper 30B is formed with plural convex portions 41 corresponding to the concave portions 22 of the concave/convex pattern 20b of the magnetic disk 10, and plural concave portions 42 corresponding to the convex portions 21 of the concave/convex pattern 20b, such that a concave/convex pattern 40b (an example of a "B1 concave/convex pattern" in the present invention) having an inverted concave/convex positional relationship with respect to the concave/convex pattern 20b is formed. In this case, the stamper 30B forms the first object in the present invention in the state in which it is affixed to the second surface 10b of the preform 10x (the state in which the preform 10x and the stampers 30A and 30B are made integral with each other: see FIG. 8). The stampers 30A and 30B are formed of a light-transmitting resin material, for example, such that they each have a shape of a flat plate having a thickness of approximately 0.6 mm, by injection molding using metal stampers manufactured according to a known method. It should be noted that the method of manufacturing the metal stampers, and the method of manufacturing resin stampers (the stampers 30A and 30B) by injection molding are known, and hence detailed description thereof is omitted.

On the other hand, the imprinting apparatus 2 is configured such that it can form etching mask patterns on the first surface 10a and second surface 10b (both of the A mask layers 18) of the preform 10x by a so-called nano imprinting method (imprinting process). Specifically, the imprinting apparatus 2 includes a press (not shown) and an ultraviolet ray irradiation device (not shown). More specifically, the imprinting apparatus 2 uses the press to press the surface formed with the concave/convex pattern 40a of the stamper 30A against the first surface 10a of the preform 10x, and press the surface formed with the concave/convex pattern 40b of the stamper 30B against the second surface 10b of the preform 10x, and in this state, uses the ultraviolet ray irradiation device to irradiate both of the A mask layers 18 with ultraviolet rays to cure the same, whereby the concave/convex pattern 40a of the stamper 30A is transferred to the A mask layer 18 on the side toward the first surface 10a, and the concave/convex pattern 40b of the stamper 30B is transferred to the A mask layer 18 on the side toward the second surface 10b.

Figure 8:
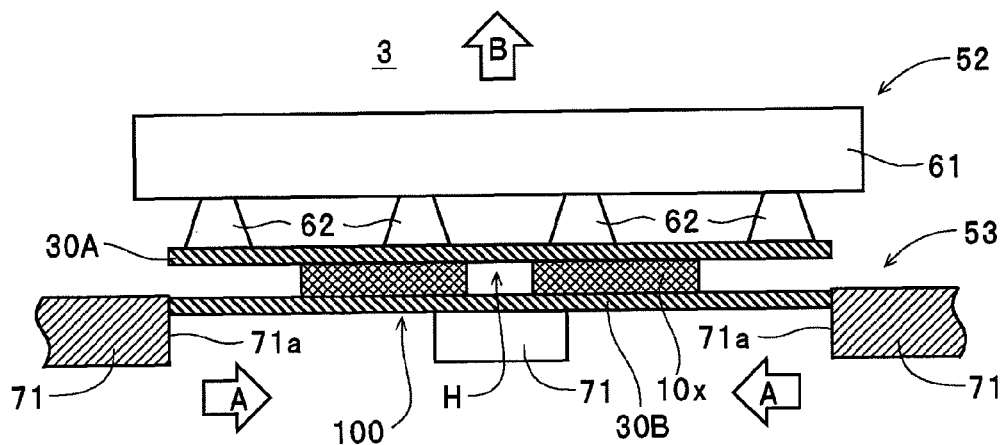
FIG. 8 is a cross-sectional view of the peeling apparatus, the preform, and upper and lower stampers in a state in which the upper stamper is held by an upper stamper holding section, and the lower stamper is held by a lower stamper holding section.
Figure 11:
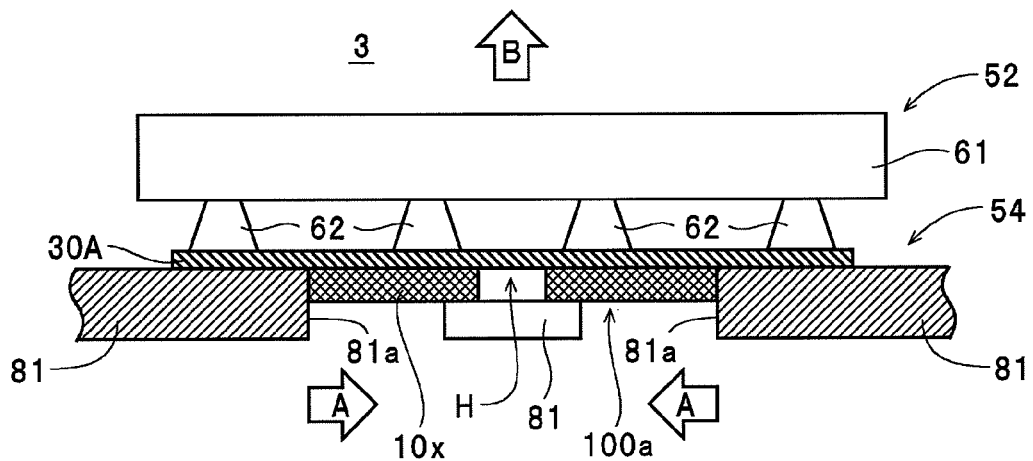
FIG. 11 is a cross-sectional view of the peeling apparatus, the preform, and the upper stamper in a state in which the upper stamper is held by the upper stamper holding section, and the preform is held by the preform holding section.

Further, the peeling apparatus 3 carries out a peeling process on the preform 10x and the stampers 30A and 30B (the laminate 100), which are made integral with each other by the imprinting process by the imprinting apparatus 2, by the peeling method according to the present invention. As shown in FIG. 1, the peeling apparatus 3 includes a moving mechanism 51, stamper holding sections 52 and 53, a preform holding section 54, and a control section 55. The moving mechanism 51 causes the stamper holding section 52 to move within the peeling apparatus 3 under the control of the control section 55. The stamper holding section 52 is an example of a second holding section in the present invention. As shown in FIGS. 8 and 11, the stamper holding section 52 has plural attracting pads 62 provided on a base portion 61 thereof, and holds the stamper 30A (the second object) by having the attracting pads 62 thereof brought into contact with the back surface (an "opposite surface" in the present invention: an upper surface of the stamper 30A, as viewed in FIGS. 8 and 11) of the stamper 30A (to thereby attract the back surface of the stamper 30A thereto). It should be noted that the attracting pads 62 are configured such that they are connected to an air pump, not shown, and the air pump operates to thereby attract the stamper 30A thereto.

Figure 4:
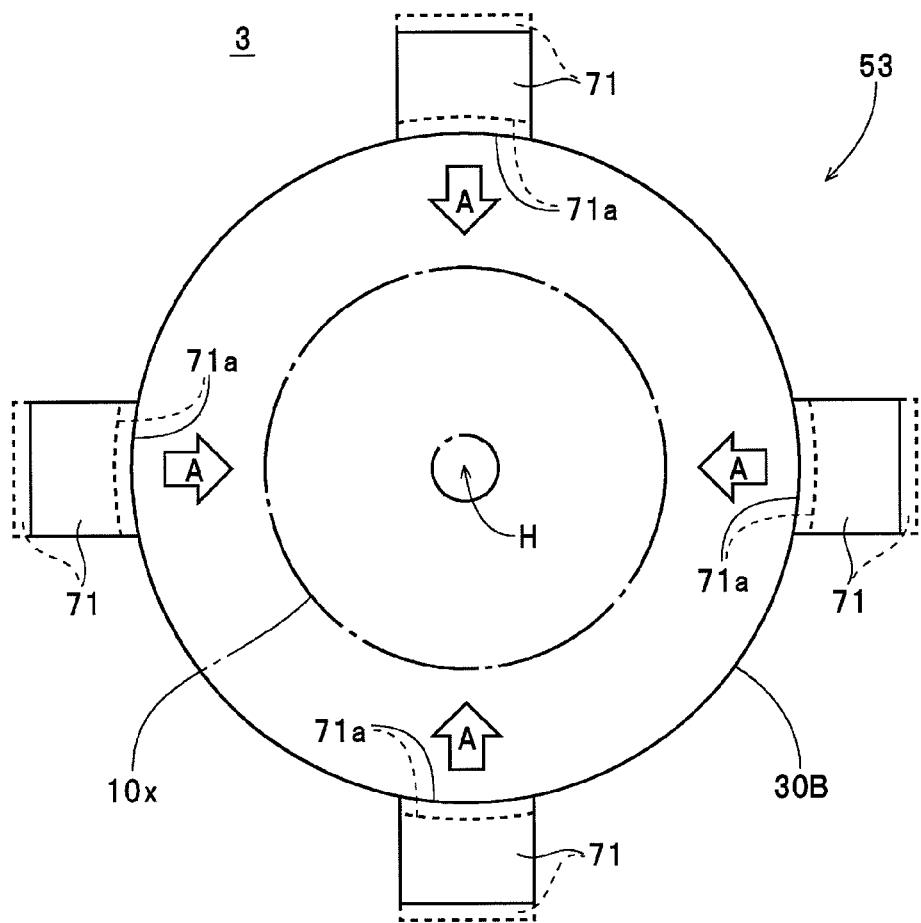
FIG. 4 is a plan view of a stamper holding section of a peeling apparatus appearing in FIG. 1, as viewed from below (from a lower stamper side in FIG. 3)

The stamper holding section 53 is an example of each of a first holding section in the present invention and a holding tool in the present invention. As shown in FIG. 4, when the stamper 30B (the first object) is peeled off the preform 10x (the second object) in the state affixed to the stamper 30A, the stamper holding section 53 holds the stamper 30B in a manner sandwiching the same. More specifically, the stamper holding section 53 includes four holding nails 71 which are brought into contact with an outer peripheral surface of the stamper 30B (an example of a surface of the stamper 30B along the direction of the thickness thereof) via four portions (an example of a configuration in which "at least two points" in the present invention is "four points"), to thereby sandwich the stamper 30B therebetween, and a moving mechanism (an actuator or the like: not shown) which causes the holding nails 71 to move in directions each indicated by an arrow A and opposite directions thereto. In this case, the peeling apparatus 3 is configured such that the control section 55 brings respective contact surfaces 71a (surface brought into contact with the stamper 30B: a "surface brought into contact with the first object" in the present invention) of the holding nails 71 into contact with an outer peripheral surface of the stamper 30B each at a predetermined uniform contact pressure, and adjusts the amounts of movement of the holding nails 71 by the above-described moving mechanism such that the contact pressures become uniform.

Figure 5:
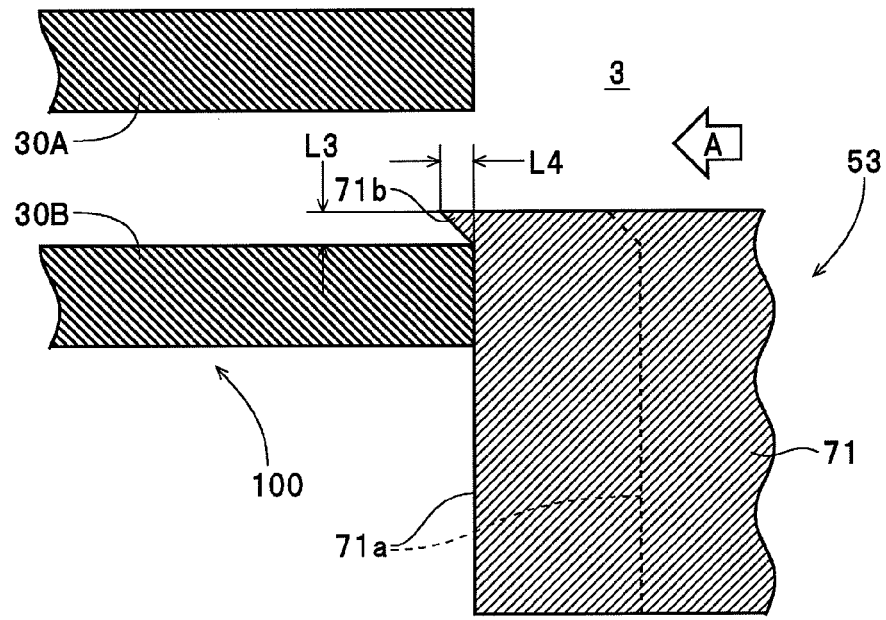
FIG. 5 is a cross-sectional view of holding nails of the stamper holding section and an outer periphery of the stamper.

Further, the contact surface 71a of each holding nail 71 is curved such that the contact surface 71a becomes arcuate in plan view in a manner matched to an outer shape of the stamper 30B. Furthermore, as shown in FIG. 5, a protrusion 71b is formed at a location (upper location as viewed in FIG. 5) toward the stamper holding section 52 with respect to a portion brought into contact with the stamper 30B in the contact surface 71a of the holding nail 71 in a manner protruding toward the stamper 30B. In this case, a length L3 of the protrusion 71b in the direction along the contact surface 71a, and a length (length L4) of the protrusion 71b protruding from the contact surface 71a are each set within a range of 0.1 mm to 0.3 mm (e.g., both of the lengths L3 and L4 are 0.15 mm). It should be noted that although in the stamper holding section 53, the protrusion 71b is formed on an upper end of the contact surface 71a of each holding nail 71 (an end of the contact surface 71a toward the stamper holding section 52), this is not limitative, but the protrusion 71b can also be formed at a location of the contact surface 71a, slightly lower than the upper end of the contact surface 71a.

The preform holding section 54 is another example of each of the first holding section in the present invention and the holding tool in the present invention. As shown in FIG. 6, when the stamper 30A (the second object) is peeled off the preform 10x (the first object) in the state in which the stamper 30B is peeled therefrom, the preform holding section 54 holds the preform 10x in a manner sandwiching the same. More specifically, the preform holding section 54 includes four holding nails 81 which are brought into contact with an outer peripheral surface of the preform 10x (an example of a surface of the preform 10x along the direction of the thickness thereof) via four portions (an example of a configuration in which "at least two points" in the present invention is "four points"), to thereby sandwich the preform 10x therebetween, and a moving mechanism (an actuator or the like: not shown) which causes each holding nail 81 to move in directions each indicated by an arrow A and opposite directions thereto. In this case, the peeling apparatus 3 is configured such that the control section 55 brings respective contact surfaces 81a (surface brought into contact with the preform 10x: a "surface brought into contact with the first object" in the present invention) of the holding nails 81 into contact with an outer peripheral surface of the preform 10x each at a predetermined uniform contact pressure, and adjusts the amounts of movement of the holding nails 81 by the above-described moving mechanism such that the contact pressures become uniform. Further, the contact surface 81a of each holding nail 81 is curved such that the contact surface 81a becomes arcuate in plan view in a manner matched to an outer shape of the preform 10x.

Further, as shown in FIG. 7, a protrusion 81b is formed at a location (upper location as viewed in FIG. 7) toward the stamper holding section 52 with respect to a portion brought into contact with the preform 10x in the contact surface 81a of each holding nail 81 in a manner protruding toward the preform 10x. In this case, the length L1 of the protrusion 81b in the direction along the contact surface 81a, and the length (length L2) of the protrusion 81b protruding from the contact surface 81a are each set within a range of 0.1 mm to 0.3 mm (e.g., both of the lengths L1 and L2 are 0.15 mm) according to the chamfering of the preform 10x. The control section 55 performs overall control of the peeling apparatus 3. More specifically, the control section 55 causes the moving mechanism 51 to move the stamper holding section 52, and controls the above-mentioned air pump to cause the stamper holding section 52 to hold (attract) the stamper 30A. Further, the control section 55 causes the moving mechanism of the stamper holding section 53 and the moving mechanism of the preform holding section 54 to move the holding nails 71 and 81 such that they hold the stamper 30B and the preform 10x.

Further, the etching apparatus 4 carries out an oxygen plasma treatment on the preform 10x which has been subjected to the peeling process for peeling the stampers 30A and 30B by the peeling apparatus 3 (the preform 10x having mask patterns formed on both of the A mask layers 18), whereby the resin material (residue) remaining on a bottom surface of each concave portion of the mask patterns is removed to cause the B mask layers 17 to be exposed from the A mask layers 18 on the bottom surface of each concave portion of the mask patterns. Subsequently, the etching apparatus 4 carries out an etching process on the preform 10x, from which the residue has been removed, to thereby form the mask patterns on both of the B mask layers 17. Further, the etching apparatus 4 carries out an etching process using the mask patterns formed on both of the B mask layers 17, thereby forming the concave/convex patterns 20a and 20b on the respective magnetic layers 14.

The conveyor 5a conveys the laminate 100 (the stampers 30A and 30B, and the preform 10x) from a position where the imprinting apparatus 2 performs the imprinting process, to a position where the peeling apparatus 3 performs the peeling process. In this case, similarly to the stamper holding section 52 of the peeling apparatus 3, the conveyor 5a holds the laminate 100 by causing plural attracting pads (not shown) to attract the back surface of the stamper 30A, by way of example. The conveyor 5b conveys the preform 10x which has been subjected to the peeling process for peeling the stampers 30A and 30B by the peeling apparatus 3 to a position where the preform 10x is subjected to the etching process by the etching apparatus 4. In this case, the conveyor 5b includes e.g., a preform holding section (not shown) for holding the preform 10x by chucking the rim of the central hole H of the preform 10x. It should be noted that although actually, the magnetic recording medium manufacturing system 1 includes a device for forming layers of the non-magnetic material 15 on the preform 10x which has the concave/convex patterns 20a and 20b formed on the respective magnetic layers 14 thereof by the etching apparatus 4, a device for smoothing the opposite surfaces of the preform 10x by etching the non-magnetic material 15, and a device for forming the protective layers 16 on the opposite surfaces of the preform 10x, illustration of the devices in figures is omitted.

Next, a description will be given of a method of manufacturing the magnetic disk 10 using the magnetic recording medium manufacturing system 1, with a particular emphasis on the peeling process by the peeling apparatus 3. It should be noted that manufacturing of the preform 10x and the stampers 30A and 30B is assumed to have already been completed.

When the magnetic disk 10 is manufactured, first, the concave/convex patterns 40a and 40b of the stampers 30A and 30B are transferred to the first surface 10a and second surface 10b (both of the A mask layers 18) of the preform 10x, to thereby form mask patterns (not shown) for the etching process. More specifically, first, the imprinting process for pressing the stampers 30A and 30B against the first surface 10a and second surface 10b of the preform 10x is performed by using the imprinting apparatus 2. In doing this, for example, the surface formed with the concave/convex pattern 40a of the stamper 30A is pressed against the first surface 10a of the preform 10x, and then the surface formed with the concave/convex pattern 40b of the stamper 30B is pressed against the second surface 10b of the preform 10x in the above state. Subsequently, both of the A mask layers 18 of the preform 10x are irradiated with ultraviolet rays via the stampers 30A and 30B, and are cured. This cures the A mask layers 18 in a state in which the respective convex portions 41 of the concave/convex patterns 40a and 40b are pushed into the A mask layers 18 of the first surface 10a and the second surface 10b, which causes the stampers 30A and 30B to be affixed to the first surface 10a and the second surface 10b to be made integral with the preform 10x, whereby the laminate 100 is manufactured. This completes the imprinting process (pressing process).

Next, the conveyor 5a conveys the laminate 100 from the position where the imprinting process has been performed by the imprinting apparatus 2, to the peeling apparatus 3. Subsequently, the control section 55 of the peeling apparatus 3 causes the moving mechanism 51 to move the stamper holding section 52 to a position above the laminate 100 conveyed by the conveyor 5a. Then, the control section 55 causes the moving mechanism 51 to bring the attracting pads 62 of the stamper holding section 52 into contact with the back surface of the stamper 30A on the laminate 100 (i.e., surface of the stamper 30A opposite from the surface thereof affixed to the preform 10x), and controls the air pump to cause the attracting pads 62 to attract (hold) the stamper 30A. This completes the holding of the stamper 30A (the laminate 100) by the stamper holding section 52. Next, the control section 55 causes the moving mechanism 51 to move the stamper holding section 52 to a position above the stamper holding section 53, while maintaining the state of the stamper 30A being held by the stamper holding section 52. In doing this, the holding nails 71 of the stamper holding section 53 have been moved to a position indicated by broken lines in FIGS. 4 and 5. Therefore, the control section 55 controls the moving mechanism 51, whereby as shown in FIG. 5, the stamper holding section 52 is moved downward to a position where the contact surfaces 71a of the holding nails 71 and the outer peripheral surface of the stamper 30B face each other.

Next, the control section 55 causes the moving mechanisms of the stamper holding section 53 to move the holding nails 71 in the directions each indicated by the arrow A in FIGS. 4 and 5 (directions in which the holding nails 71 approach the stamper 30B from lateral sides thereof). In doing this, as indicated by a solid line in FIG. 5 and as shown in FIG. 8, the contact surfaces 71a of the holding nails 71 are brought into contact with the outer peripheral surface of the stamper 30B (the surface of the first object along the direction of the thickness thereof) (via four portions) at the predetermined contact pressure, whereby the stamper 30B is held by the holding nails 71 in a manner sandwiched thereby. This completes the holding of the stamper 30B by the stamper holding section 53.

Figure 9:
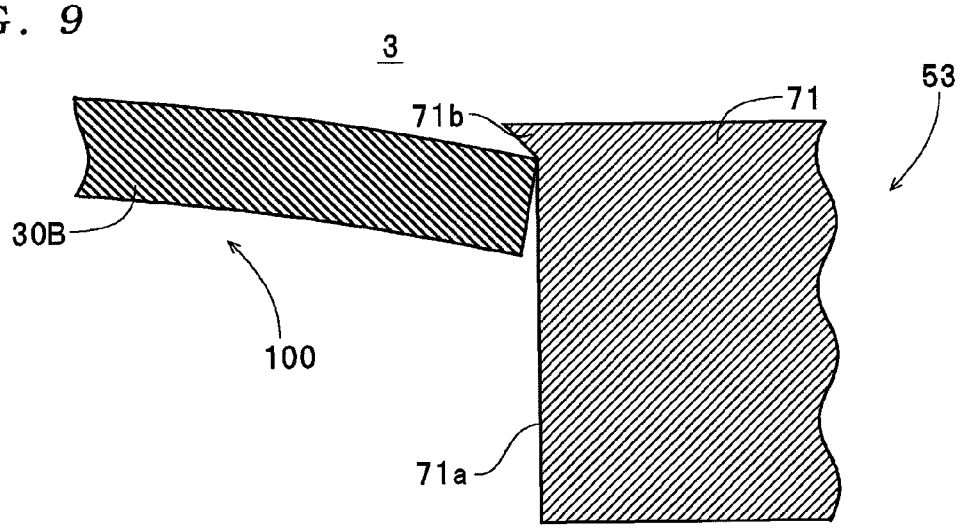
FIG. 9 is a cross-sectional view of an outer periphery of the lower stamper in a bent state, and a contact surface and its vicinity of a holding nail.

Next, the control section 55 causes the moving mechanism 51 to move (lift) the stamper holding section 52 in a direction indicated by an arrow B (a direction away from the stamper holding section 53). In doing this, as the stamper holding section 52 (the stamper 30A) moves in the direction away from the stamper holding section 53 (the stamper 30B), the preform 10x, which is affixed to the stamper 30A held by the stamper holding section 52, moves together with the stamper 30A in the direction indicated by the arrow B, whereby the central portion of the stamper 30B affixed to the preform 10x moves (rises) together with the preform 10x. Further, the moving mechanisms of the stamper holding section 53 are controlled by the control section 55 such that the above-described contact pressures of the contact surfaces 71a of the holding nails 71, applied to the outer peripheral surface of the stamper 30B, become uniform, whereby the holding nails 71 move in the directions each indicated by the arrow A (directions from the outer periphery of the stamper 30B toward the central portion thereof). This bends the stamper 30B such that the central portion thereof protrudes upward, as shown in FIG. 9. As a consequence, the stamper 30B is gradually peeled off the preform 10x from the outer periphery of the preform 10x toward the rim of the central hole H thereof. In doing this, when the stamper 30B is bent more largely as the stamper holding section 52 (with the stamper 30A and the preform 10x) is gradually moved, the moving mechanisms of the stamper holding section 53 are controlled by the control section 55 such that the contact pressures of the contact surfaces 71a, applied to the outer peripheral surface of the stamper 30B, become uniform. This causes the holding nails 71 to further move in the directions each indicated by the arrow A.

Figure 10:
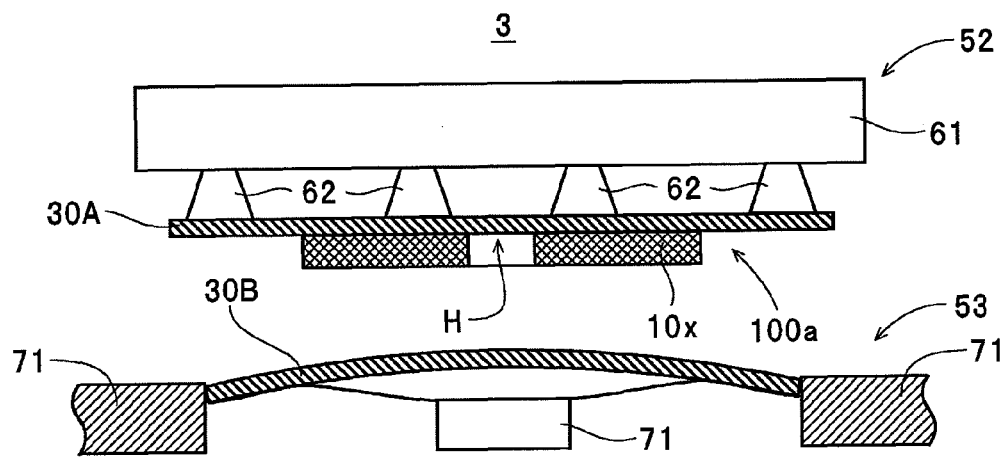
FIG. 10 is a cross-sectional view of the peeling apparatus, the preform, and the stampers in a state in which peeling of the lower stamper off the preform is completed.

Further, in the peeling apparatus 3, the stamper holding section 53 has the protrusion 71b formed on the contact surface 71a of each holding nail 71 thereof. Therefore, as shown in FIG. 9, even if the stamper 30B is about to move upward together with the stamper 30A and the preform 10x, the outer periphery thereof is caught by the protrusions 71b, which prevents the stamper 30B from being removed from the stamper holding section 53 (the holding nails 71). Furthermore, in the peeling apparatus 3, while the stamper 30B is bent along with the movement of the stamper holding section 52, the stamper 30A is held by the stamper holding section 52 because of attraction of the back surface thereof by the attracting pads 62, which prevents the stamper 30A from being largely bent as in the case of the stamper 30B. This allows only the stamper 30B to be peeled off the preform 10x, while maintaining the state of the preform 10x being affixed to the stamper 30A. This completes the peeling process for peeling the stamper 30B (the first object) off the preform 10x (the laminate 100a: the second object in the present invention) in the state affixed to the stamper 30A, as shown in FIG. 10.

Next, the control section 55 causes the moving mechanism 51 to move the stamper holding section 52 to a position above the preform holding section 54, while maintaining the state of the stamper 30A being held by the stamper holding section 52. In doing this, each holding nail 81 of the preform holding section 54 has been moved to a position indicated by broken lines in FIGS. 6 and 7. Therefore, by controlling the moving mechanism 51, the control section 55 causes the stamper holding section 52 to move downward to a position where the contact surfaces 81*a* of the holding nails 81 and the outer peripheral surface of the preform 10*x* face each other, as shown in FIG. 7.

Next, the control section 55 causes the moving mechanisms of the preform holding section 54 to move the holding nails 81 in the directions each indicated by the arrow A in FIGS. 6 and 7 (directions in which the holding nails 81 approach the preform 10*x* from lateral sides thereof). In doing this, as shown in FIG. 11, the contact surfaces 81*a* of the holding nails 81 are brought into contact with the outer peripheral surface of the preform 10*x* (the surface of the first object along the direction of the thickness thereof) (via four portions) at the predetermined contact pressure, whereby the preform 10*x* is held by the holding nails 81 in a manner sandwiched thereby. In this case, as indicated by the solid line in FIG. 7, the protrusion 81*b* of each holding nail 81 is engaged with the outer periphery (the associated chamfered portion) of the preform 10*x* on the side toward the first surface 10*a*. This completes the holding of the preform 10*x* by the preform holding section 54. In this case, the preform holding section 54 holds the preform 10*x* without being brought into contact with the second surface 10*b*, which makes it possible to prevent the second surface 10*b* of the preform 10*x* from being stained or scratched during the following peeling process.

Figure 12:
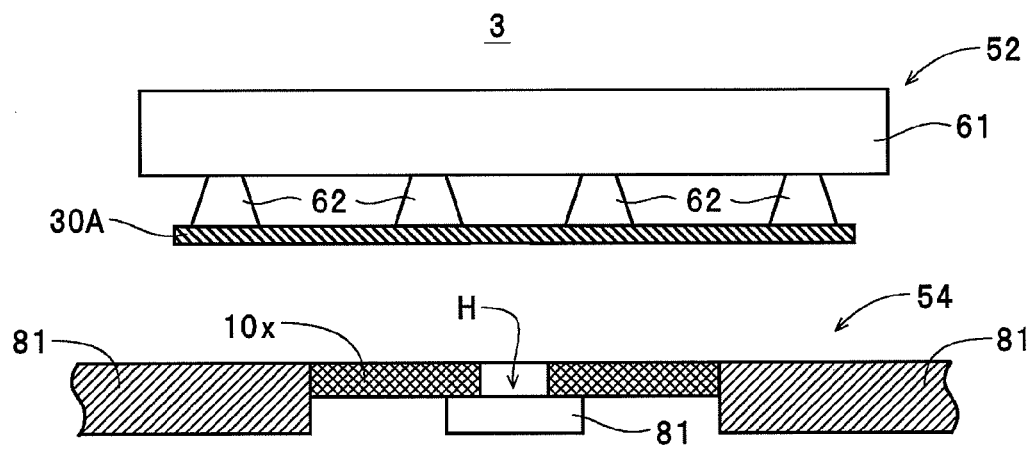
FIG. 12 is a cross-sectional view of the peeling apparatus, the preform, and the stampers in a state in which peeling of the upper stamper off the preform is completed.

Next, the control section 55 causes the moving mechanism 51 to move (lift) the stamper holding section 52 in the direction indicated by the arrow B (the direction away from the preform holding section 54). In doing this, as the stamper 30A held by the stamper holding section 52 moves in the direction indicated by the arrow B, the preform 10*x* held by the preform holding section 54 is peeled off the stamper 30A. In doing this, as shown in FIG. 7, the protrusions 81*b* of the holding nails 81 of the preform holding section 54 are engaged with the outer periphery (the associated chamfered portion) of the preform 10*x* on the side toward the first surface 10*a*, which prevents the preform 10*x* from being removed from the preform holding section 54 (the holding nails 81), and therefore from being moved upward together with the stamper 30A. This completes the peeling process for peeling the preform 10*x* (the first object) off the stamper 30A (the second object in the present invention), as shown in FIG. 12, whereby a mask pattern (etching concave/convex pattern: an example of each of the "A2 concave/convex pattern" and "C2 concave/convex pattern" in the present invention) having an inverted concave/convex positional relationship with respect to the concave/convex pattern 40*a* (the "A1 concave/convex pattern" or the "C1 concave/convex pattern" in the present invention) of the stamper 30A is formed on the first surface 10*a* of the preform 10*x*, and a mask pattern (etching concave/convex pattern: an example of the "B2 concave/convex pattern" in the present invention) having an inverted concave/convex positional relationship with respect to the concave/convex pattern 40*b* (the "B1 concave/convex pattern" in the present invention) of the stamper 30B is formed on the second surface 10*b* of the preform 10*x*.

Then, the conveyor 5*b* conveys the preform 10*x*, which has been subjected to the peeling process for peeling the stampers 30A and 30B, to a position where the preform 10*x* is subjected to the etching process by the etching apparatus 4. In doing this, the conveyor 5*b* holds the preform 10*x* by chucking the rim of the central hole H of the preform 10*x*, which prevents the first surface 10*a* and second surface 10*b* of the preform 10*x* from being stained or scratched during conveyance of the preform 10*x* from the position where the preform 10*x* has been subjected to the peeling process by the peeling apparatus 3, to the position where the preform 10*x* is subjected to the etching process by the etching apparatus 4. Subsequently, the etching process using the above-described mask patterns is performed on the preform 10*x* by the etching apparatus 4. In doing this, first, e.g., the oxygen plasma treatment is carried out on the first surface 10*a* and second surface 10*b* of the preform 10*x*, whereby the resin material (residue) remaining on a bottom surface of each concave portion of the concave/convex patterns (the mask patterns) formed on both of the A mask layers 18 is removed to cause the B mask layers 17 to be exposed from the A mask layers 18 on the bottom surface of each concave portion of the concave/convex patterns formed on the A mask layers 18.

Next, both of the B mask layers 17 are etched by the etching process using the concave/convex patterns (the mask patterns) formed on the A mask layers 18, respectively, whereby concave/convex patterns (not shown) formed by the B mask layers 17 are formed on both of the magnetic layers 14, respectively. In doing this, in the magnetic recording medium-manufacturing system 1, a manufacturing tool or the like (e.g., the attracting stage in the conventional transfer apparatus) is prevented from being brought into contact with the first surface 10*a* and second surface 10*b* of the preform 10*x*, after the start of pressing of the stampers 30A and 30B against the preform 10*x* up to the conveyance of the preform 10*x* to the etching apparatus 4 after completion of peeling of both the stampers 30A and 30B. Therefore, the first surface 10*a* and the second surface 10*b* are not stained or scratched, which prevents defective formation of the mask patterns due to stains or scratches on the surfaces 10*a* and 10*b*, thereby making it possible to accurately form the mask patterns.

Then, both of the magnetic layers 14 are etched by performing the etching process using the mask patterns formed on both of the B mask layers as masks, whereby the concave/convex patterns 20*a* and 20*b* having the plural convex portions 21 and the plural concave portions 22 are formed on the magnetic layers 14. This forms the data track pattern and the servo pattern on the intermediate layers 13 (not shown). Next, the B mask layer 17 remaining on each convex portion 21 is selectively removed by the etching process to cause a protruding end face of each convex portion 21 to be exposed. Then, $SiO_2$ as the non-magnetic material 15 is sputtered to thereby cover the surfaces formed with the concave/convex patterns 20*a* and 20*b* with the non-magnetic material 15, whereby layers (not shown) of the non-magnetic material 15 are formed.

Then, an ion beam etching process is carried out on the layers of the non-magnetic material 15 on the magnetic layers 14 (on each convex portion 21 and each concave portion 22). In doing this, the ion beam etching process is continued e.g., until the protruding end face of each convex portion 21 is caused to be exposed from the non-magnetic material 15. This smooths the opposite surfaces of the preform 10*x*. Then, thin films of diamond-like carbon (DLC) are formed by a chemical vapor deposition (CVD) method such that the thin films cover the surfaces of the preform 10*x*, thereby forming the protective layers 16. After that, fluorine-based lubricant is applied to the surfaces of the protective layers 16 such that the average thickness of the applied lubricant is approximately 2 nm, whereby the magnetic disk 10 is completed, as shown in FIG. 2. This completes the method of manufacturing an information recording medium according to the present invention.

As described above, in the peeling apparatus 3 and the peeling method by the peeling apparatus 3, when the stamper 30B is peeled off the preform 10x in the state in which the stamper 30A (the second object) having the preform 10x affixed thereto, and the stamper 30B (the first object), which is affixed to the preform 10x affixed to the stamper 30A and is made integral with the preform 10x, are held by the stamper holding section 52 and the stamper holding section 53, respectively, the stamper 30B is peeled off the preform 10x while being held by bringing the holding nails 71 into contact with the surface (the outer peripheral surface) of the stamper 30B along the direction of the thickness thereof via four portions thereof (via four points). Further, when the stamper 30A is peeled off the preform 10x in the state in which the stamper 30A (the second object) and the preform 10x (the first object), which is affixed to the stamper 30A for integration, are held by the stamper holding section 52 and the preform holding section 54, respectively, the stamper 30A is peeled off the preform 10x while being held by bringing the holding nails 81 into contact with the surface (the outer peripheral surface) of the preform 10x along the direction of the thickness thereof via four portions thereof (via four points).

Therefore, according to the peeling apparatus 3 and the peeling method by the peeling apparatus 3, when the stamper 30B is peeled off the preform 10x, the stamper 30B bends to be easily peeled off the preform 10x. This makes it possible to prevent the preform 10x from being peeled off the stamper 30A, to thereby reliably peel the stamper 30B while maintaining the state of the preform 10x being affixed to the stamper 30A. Accordingly, even if the sequence of steps is automated, it is possible to prevent a state where the preform 10x is stained or scratched due to the preform 10x being peeled off the stamper 30A together with the stamper 30B, and being stacked together with the stamper 30B at a predetermined process completion position. Further, since it is possible to prevent the preform 10x from coming off both the stampers 30A and 30B by unintended removal of the preform 10x from the stamper 30A, it is possible to prevent the preform 10x from being stained or scratched. Further, according to the peeling apparatus 3 and the peeling method using the peeling apparatus 3, when the stamper 30A is peeled off the preform 10x, the preform 10x is held in a state in which the peeling apparatus 3 is kept from contact with the second surface 10b of the preform 10x, which makes it possible to prevent the second surface 10b of the preform 10x from being stained or scratched.

Further, in the peeling apparatus 3, each holding nail 71 is configured such that the protrusion 71b is formed at a location toward the preform 10x and the stamper 30A (the second object) with respect to a portion brought into contact with the stamper 30B in the contact surface 71a for contact with the stamper 30B, and each holding nail 81 is configured such that the protrusion 81b is formed at a location toward the stamper 30A (the second object) with respect to a portion brought into contact with the preform 10x in the contact surface 81a for contact with the preform 10x. Further, in the peeling method using the peeling apparatus 3, the stamper 30B is held using the holding nails 71 (holding tools) wherein the protrusion 71b is formed at a location toward the preform 10x and the stamper 30A (the second object) with respect to a portion brought into contact with the stamper 30B in the contact surface 71a for contact with the stamper 30B (the first object), and the preform 10x is held using the holding nails 81 (holding tools) wherein the protrusion 81b is formed at a location toward the stamper 30A (the second object) with respect to a portion brought into contact with the preform 10x in the contact surface 81a for contact with the preform 10x (the first object).

Therefore, according to the peeling apparatus 3 and the peeling method by the peeling apparatus 3, when the stamper 30B is peeled off the preform 10x, it is possible to reliably peel the stamper 30B off the preform 10x, while preventing the stamper 30B from coming off the stamper holding section 53 and moving toward the stamper holding section 52 together with the stamper 30A and the preform 10x, which makes it possible to prevent the preform 10x from being stained or scratched. Further, when the stamper 30A is peeled off the preform 10x, it is possible to reliably peel the stamper 30A off the preform 10x, while preventing the preform 10x from coming off the preform holding section 54 and moving toward the stamper holding section 52 together with the stamper 30A, which makes it possible to prevent the preform 10x from being stained or scratched.

Furthermore, according to the peeling apparatus 3 and the peeling method using the peeling apparatus 3, the stamper 30A is held by contact with a surface of the stamper 30A (the second object) opposite from a surface thereof affixed to the preform 10x (by attracting the opposite surface by the attracting pads 62), whereby when the stamper 30B is peeled off the preform 10x, it is possible to prevent the preform 10x from peeling and coming off the stamper 30A due to bending of the stamper 30A which should maintain the state attached to the preform 10x. This makes it possible to prevent the preform 10x from being stained or scratched.

Further, according to the peeling apparatus 3 and the peeling method using the peeling apparatus 3, when the stamper 30B (the first object) is held by the stamper holding section 53, the stamper 30B is held by bringing the holding nails 71 (the contact surfaces 71a) thereof into contact with the outer peripheral surface of the stamper 30B (of the first object) as the "surface along the direction of the thickness thereof" in the present invention, and when the preform 10x (the first object) is held by the preform holding section 54, the preform 10x is held by bringing the holding nails 81 (the contact surfaces 81a) into contact with the outer peripheral surface of the preform 10x as the "surface along the direction of the thickness thereof" in the present invention. Therefore, for example, compared with the construction in which the stampers 30A and 30B and the preform 10x are held by bringing the holding nails into contact the central hole H of the preform 10x or the inner peripheral surfaces of the central holes of the stampers 30A and 30B, it is possible to reliably hold the object to be held, so that it is possible to prevent the preform 10x and so forth from being stained or scratched.

Further, according to the method of manufacturing the magnetic disk 10 by the magnetic recording medium manufacturing system 1, when the stamper 30B (the B stamper) is peeled off the preform 10x (substrate), which is integrated with the stamper 30A (the A stamper) by pressing the stamper 30A against the preform 10x, by the peeling apparatus 3, the stamper 30B is peeled off the preform 10x while being held by bringing the holding nails 71 into contact with the surface of the stamper 30B along the direction of the thickness thereof via four portions thereof (via four points). This causes the stamper 30B to bend to be easily peeled off the preform 10x, so that it is possible to prevent the preform 10x from being peeled off the stamper 30A, to thereby reliably peel the stamper 30B while maintaining the state of the preform 10x being affixed to the stamper 30A. Accordingly, even if the sequence of the steps is automated, it is possible to prevent a state where the preform 10x is stained or scratched due to the preform 10x being peeled off the stamper 30A together with the stamper 30B, and being stacked together with the stamper 30B at the predetermined process completion position. Further, it is possible to prevent unintended removal of the preform 10x from the stamper 30A, which makes it possible to prevent the preform 10x from being stained or scratched by the removal of the preform 10x from both the stampers 30A and 30B.

Further, according to the method of manufacturing the magnetic disk 10 using the magnetic recording medium manufacturing system 1, when the stamper 30A (the C stamper) is peeled off the preform 10x (substrate) using the peeling apparatus 3, the stamper 30A is peeled off the preform 10x while holding the preform 10x by bringing the holding nails 81 into contact with the surface of the preform 10x along the direction of the thickness thereof via four portions thereof (via four points), whereby the preform 10x can be held in the state in which the peeling apparatus 3 is kept from contact with the second surface 10b of the preform 10x. As a result, it is possible to prevent the second surface 10b of the preform 10x from being stained or scratched.

It should be noted that the present invention is not limited to the above-described methods and constructions. For example, although the description has been given of the construction in which the moving mechanism 51 and the stamper holding sections 52 and 53 are used in peeling the stamper 30B, while the moving mechanism 51, the stamper holding section 52, and the preform holding section 54 are used in peeling the stamper 30A (the construction in which the moving mechanism 51 and the stamper holding section 52 are commonly used), by way of example, the present invention is not limited to this, but it is also possible to employ a construction in which in respective cases of peeling the stamper 30B and peeling the stamper 30A, there used are respective different stamper holding sections formed independently of each other (as the stamper holding section 52 in the above example), and respective different moving mechanisms formed independently of each other (as the moving mechanism 51 in the above example). Further, it is also possible to employ a construction in which each of the stampers 30A and 30B is peeled by a single device (a pair of the first holding section and the second holding section).

Figure 13:
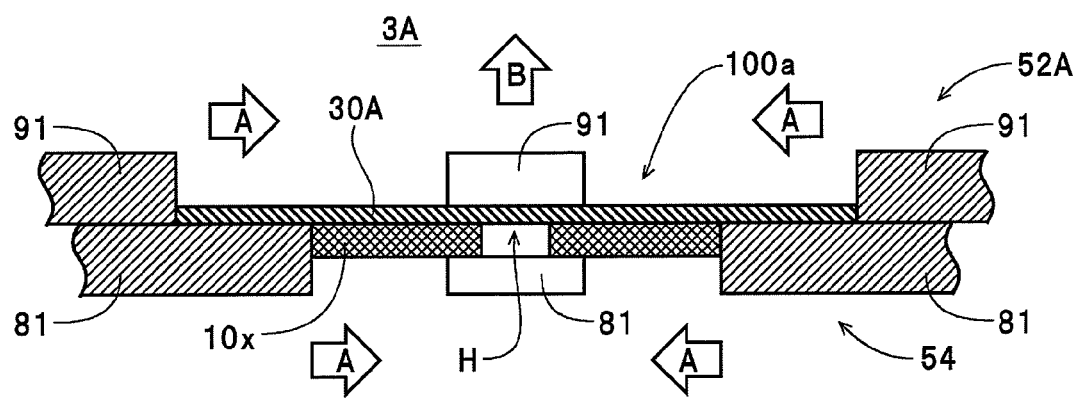
FIG. 13 is a cross-sectional view of a variation of the peeling apparatus, the preform, and the upper stamper in a state in which the upper stamper is held by the upper stamper holding section, and the preform is held by the preform holding section.

Furthermore, although the peeling apparatus 3 of the magnetic recording medium manufacturing system 1 is configured such that the stampers 30A, which is an example of the second object in the present invention, is held by being attracted by the plural attracting pads 62, the construction of the second holding section in the present invention is not limited to this. For example, as in a stamper holding section 52A of a peeling apparatus 3A, shown in FIG. 13, similarly to the above-mentioned stamper holding section 53 and preform holding section 54, it is possible to employ a construction in which the stamper 30A is held by bringing plural holding nails 91 into contact with the outer peripheral surface of the stamper 30A (surface of the stamper 30A along the direction of the thickness thereof) in a manner sandwiching the stamper 30A by the holding nails 91. It should be noted that in the peeling apparatus 3A, component elements having the same functions as those of the component elements of the above-described peeling apparatus 3 are denoted by identical reference numerals and duplicate description thereof will be omitted.

By employing the above construction, in the peeling process, the central portion of the stamper 30A is bent in a manner protruding downward (toward the preform 10x), so that the stamper 30A can be smoothly peeled off the preform 10x, similarly to the case where the stamper 30B is peeled off the preform 10x using the above-described stamper holding sections 52 and 53. It should be noted that when the peeling process for peeling the stamper 30B off the preform 10x affixed to the stamper 30A is carried out on the above-described laminate 100 (when the stamper 30A and the preform 10x are held as the second objects in the present invention), there is a risk that due to bending of the stamper 30A, the preform 10x in the state affixed to the stamper 30B is peeled off the stamper 30A, or the preform 10x is peeled off both the stamper 30A and the stamper 30B, and therefore it is preferable to hold the stamper 30A by the above-mentioned stamper holding section 52 without using the stamper holding section 52A.

Figure 14:
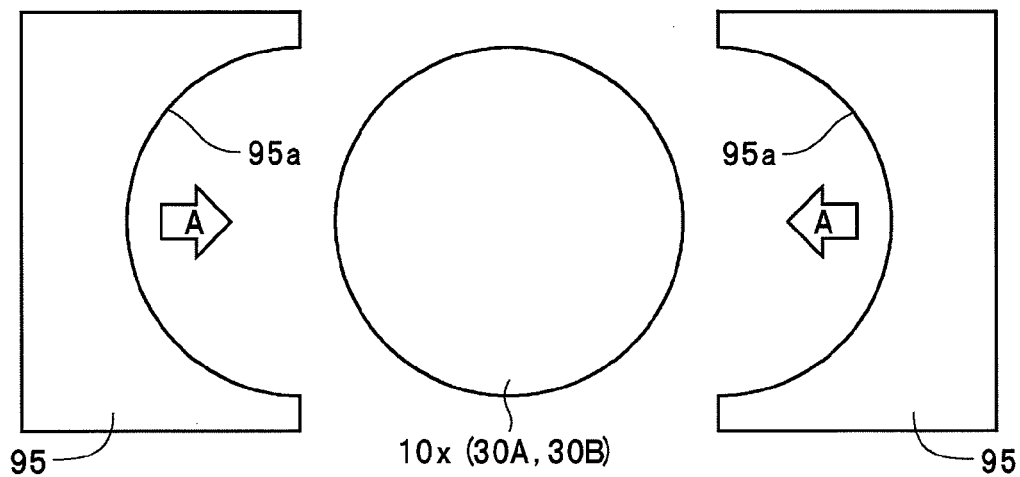
FIG. 14 is a plan view of holding nails and a preform (stampers) for another embodiment.

Further, although the above-described peeling apparatus 3 includes the stamper holding section 53 having the four holding nails 71 (holding section (holding tool) configured to be brought into contact with the outer peripheral surface of the stamper 30B via the four points), and the preform holding section 54 having the four holding nails 81 (holding section (holding tool) configured to be brought into contact with the outer peripheral surface of the preform 10x via the four points), this is not limitative, but it is possible to employ a construction (method) which holds the first object, the B stamper, or the substrate by bringing contact surfaces of holding nails into contact with the outer peripheral surface thereof along the direction of the thickness via two or three points in a manner sandwiching the same, or a construction (method) which holds these by bringing contact surfaces of holding nails into contact with the outer peripheral surface thereof via five or more points in a manner sandwiching the same. In this case, as shown in FIG. 14, it is possible to employ e.g., a construction (method) which holds the preform 10x (stampers 30A or 30B) in a manner sandwiching the preform 10x (stampers 30A or 30B) by a pair of holding nails 95, which are formed by curving contact surfaces 95a thereof into a semi-circular shape such that the contact surfaces 95a are brought into contact with the whole periphery of an outer peripheral surface of the preform 10x (stampers 30A and 30B).

Figure 15:
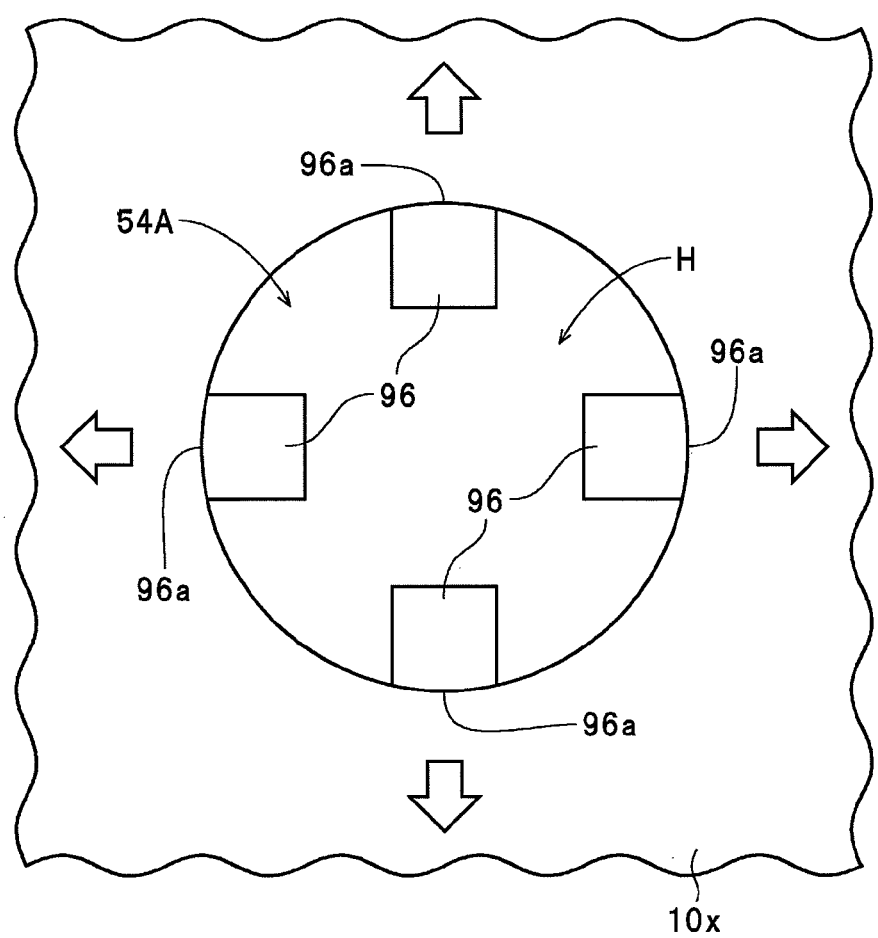
FIG. 15 is a plan view of holding nails (preform holding section) and a preform for still another embodiment.

Furthermore, although the above-described peeling apparatus 3 includes the preform holding section 54 which is configured to hold the preform 10x in a manner sandwiching the preform 10x by bringing the contact surfaces 81a of the holding nails 81 into contact with the outer peripheral surface of the preform 10x, this is not limitative, but as in the preform holding section 54A shown in FIG. 15, it is possible to employ a construction which holds the preform 10x by bringing contact surfaces 96a of respective holding nails 96 into contact with the inner peripheral surface (another example of the surface of the preform 10x along the direction of the thickness thereof) of the central hole H of the preform 10x, in a manner expanding the central hole H. It should be noted that the number of the holding nails 96 is not limited to 4, but it is possible to employ holding nails with an arbitrary number not smaller than 2 (a construction which is brought into contact with the inner peripheral surface of the central hole H via two or more points). Further, by forming central holes (not shown) in the central portions of the above-described stampers 30A and 30B, similarly to the central hole H of the preform 10x, the stampers 30A and 30B as well can be held by the same construction as that of the preform holding section 54A.

Figure 16:
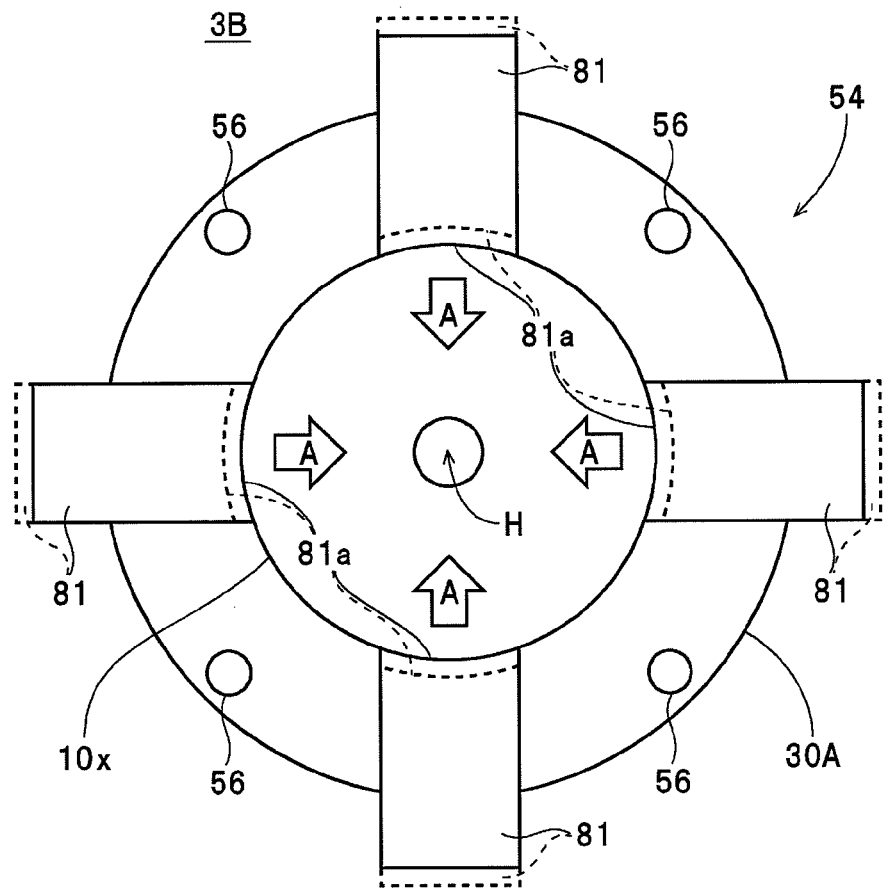
FIG. 16 is a plan view of a preform holding section and pin members of a peeling apparatus for still another embodiment, as viewed from below (from a preform side)

Further, although the above-described peeling apparatus 3 is configured such that in the state in which the stamper 30A is held by the stamper holding section 52 and the preform 10x is held by the preform holding section 54, the stamper holding section 52 (stamper 30A) is moved in a direction away from the preform holding section 54 (the preform 10x), whereby the stamper 30A is peeled off the preform 10x, this is not limitative. For example, a peeling apparatus 3B shown in FIGS. 16 and 17 employs a construction in which it includes plural pin members 56 which are arranged such that they can be brought into contact with an outer peripheral portion (portion extending off the preform 10x) of the stamper 30A affixed to the preform 10x (made integral with the preform 10x), and is configured such that the pin members 56 are thrust upward to bend the stamper 30A before the stamper holding section 52 is moved from the preform holding section 54. It should be noted that component elements having the same functions as those of the component elements of the above-described peeling apparatus 3 are denoted by identical reference numerals and duplicate description thereof will be omitted.

Figure 17:
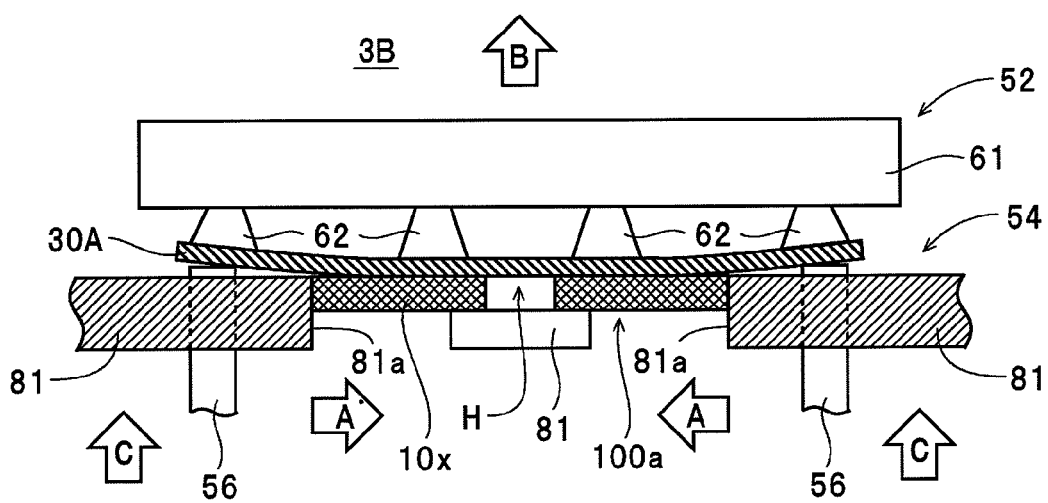
FIG. 17 is a cross-sectional view of the peeling apparatus, the preform, and the stamper appearing in FIG. 16, in a state in which the stamper is held by the stamper holding section, the preform is held by the preform holding section, and the stamper is thrust upward in a peeling direction by the pin members.
Figure 18:
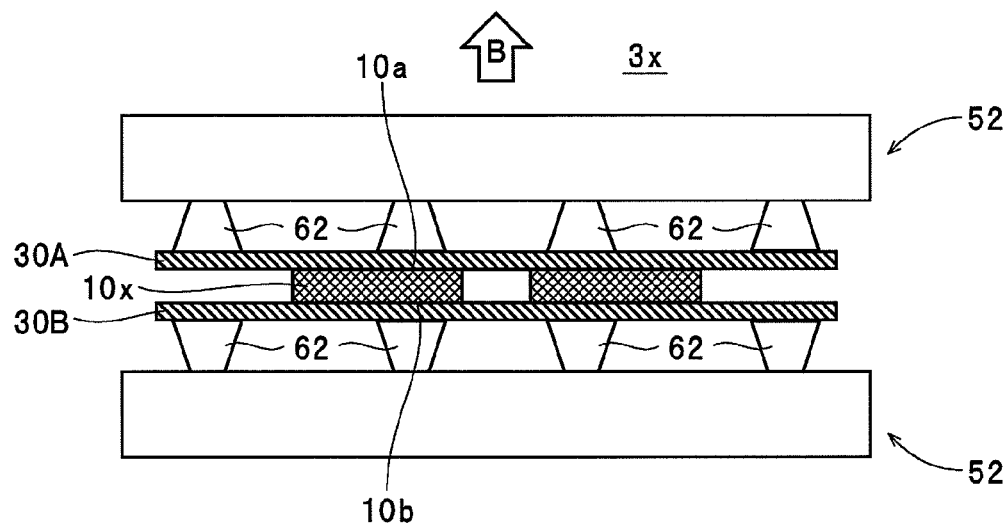
FIG. 18 is a cross-sectional view of a peeling apparatus developed by the present inventors, a preform, and stampers, in a state in which one of the stampers is held by one of stamper holding sections, and the other stamper is held by the other stamper holding section.
Figure 19:
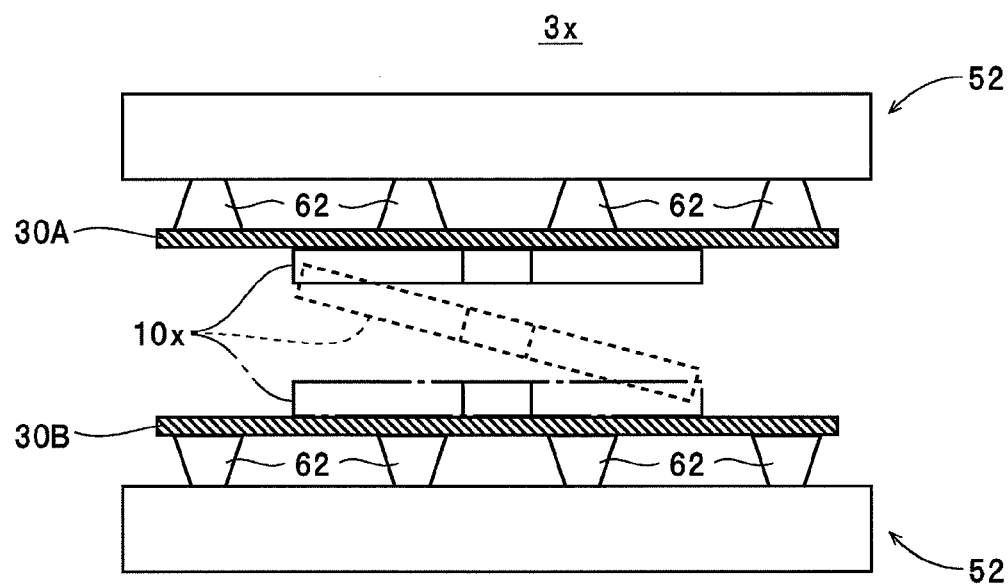
FIG. 19 is a cross-sectional view of the peeling apparatus, the preform, and the stampers appearing in FIG. 18 in a state in which the one stamper holding section is moved away from the other stamper holding section.

When the peeling process is carried out by the peeling apparatus 3B, first, the stamper 30A is held by the stamper holding section 52, and the preform 10x is held by the preform holding section 54, and in the state as shown in FIG. 17, the pin members 56 are moved by a predetermined amount in a direction indicated by arrows C (a direction in which the stamper 30A is peeled off the preform 10x). At this time, as shown in FIG. 17, the outer peripheral portion of the stamper 30A is thrust upward by the pin members 56 along with the movement (upward movement) of the pin members 56, and is bent in a manner such that the stamper 30A moves away from the preform 10x. Then, the stamper holding section 52 (the stamper 30A) is moved in the direction away from the preform holding section 54 (the preform 10x). At this time, since the stamper 30A is bent such that the outer peripheral portion thereof moves away from the preform 10x, the stamper 30A is smoothly peeled off the preform 10x starting from the outer peripheral portion side to the central portion side of an area where the stamper 30A and the preform 10x are affixed to each other.

Furthermore, although the above description has been given of the example in which are used resin stampers (the stampers 30A and 30B) made of a resin material and molded by injection molding using metal stampers, this is not limitative, but stampers in the form of a flat plate which are e.g., made of quartz may be used as the A stamper and the B stamper in the present invention. Further, when the A mask layer 18 is made of a thermoplastic resin material or a thermosetting resin material in place of the aforementioned ultraviolet-curing resin material, stampers made of metal materials, such as nickel, may be used as the A stamper and the B stamper in the present invention. Furthermore, in the present invention, the respective shapes of the first object, the second object, the substrate, and the stampers in plan view are not limited to circular shapes, but the present invention can be applied to peeling processes which are carried out on flat plates having various shapes, to thereby peel the flat plates. In addition, the peeling method and the method of manufacturing an information recording medium according to the present invention can be applied not only to manufacturing of magnetic recording media, such as the magnetic disk 10, but also to manufacturing of optical disks, magneto-optical disks, and semiconductor devices.

What is claimed is:

1. A peeling apparatus including a first holding section that holds a first object which is in the form of a flat plate, and a second holding section that holds a second object which is in the form of a flat plate and is affixed to the first object to be integral therewith, the peeling apparatus being configured to be capable of peeling one of the first object and the second object off the other by moving one of the first holding section and the second holding section away from the other in a direction perpendicular to a plane of the flat plates of the first object and the second object in a state in which the first holding section holds the first object and the second holding section holds the second object, wherein a protrusion is formed at a location toward the second holding section with respect to a portion brought into contact with the first object in a surface of the first holding section for contact with the first object, and the first holding section is configured to be capable of holding the first object by being brought into contact with a surface of the first object along a direction of a thickness thereof via at least two points without contacting a surface of the first object opposite from a surface thereof affixed to the second object; and wherein the second holding section is configured to be capable of holding the second object by being brought into contact with a surface of the second object opposite from a surface thereof affixed to the first object.

2. The peeling apparatus according to claim 1, wherein the first holding section holds the first object by being brought into contact with an outer peripheral surface of the first object as the surface along the direction of the thickness thereof.

* * * * *